US010910366B2

(12) United States Patent
Brewer

(10) Patent No.: US 10,910,366 B2
(45) Date of Patent: *Feb. 2, 2021

(54) 3D STACKED INTEGRATED CIRCUITS HAVING FUNCTIONAL BLOCKS CONFIGURED TO ACCELERATE ARTIFICIAL NEURAL NETWORK (ANN) COMPUTATION

(71) Applicant: Micron Technology, Inc., Boise, ID (US)

(72) Inventor: Tony M. Brewer, Plano, TX (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/561,486

(22) Filed: Sep. 5, 2019

(65) Prior Publication Data

US 2020/0135720 A1    Apr. 30, 2020

Related U.S. Application Data

(63) Continuation of application No. 16/169,919, filed on Oct. 24, 2018, now Pat. No. 10,461,076.

(51) Int. Cl.
*H01L 23/48*   (2006.01)
*H01L 27/06*   (2006.01)
(Continued)

(52) U.S. Cl.
CPC .... *H01L 27/0694* (2013.01); *H01L 21/76898* (2013.01); *H01L 23/3107* (2013.01);
(Continued)

(58) Field of Classification Search
CPC ............. H01L 25/0657; H01L 25/0694; H01L 23/481; H01L 23/3107
See application file for complete search history.

(56) References Cited

U.S. PATENT DOCUMENTS 5,862,396 A   1/1999  Motomura
6,279,088 B1  8/2001  Elliott et al.
(Continued)

FOREIGN PATENT DOCUMENTS

CN   104701309 A   6/2015
CN   105789139 A   7/2016
CN   108256637 A   7/2018

OTHER PUBLICATIONS

Vivienne Sze, Yu-Hsin Chen, Joel Emer, Amr Suleiman, Zhengdong Zhang, "Hardware for Machine Learning: Challenges and Opportunities", Aug. 1, 2017.
(Continued)

*Primary Examiner* — Phuc T Dang
(74) *Attorney, Agent, or Firm* — Greenberg Traurig

(57) ABSTRACT

A three-dimensional stacked integrated circuit (3D SIC) for implementing an artificial neural network (ANN) having a memory die having an array of memory partitions. Each partition of the array of memory partitions is configured to store parameters of a set of neurons. The 3D SIC also has a processing logic die having an array of processing logic partitions. Each partition of the array of processing logic partitions is configured to: receive input data, and process the input data according to the set of neurons to generate output data.

19 Claims, 12 Drawing Sheets

(51) Int. Cl.
    *H01L 25/065* (2006.01)
    *H01L 25/10* (2006.01)
    *H01L 21/768* (2006.01)
    *H01L 23/495* (2006.01)
    *H01L 23/31* (2006.01)

(52) U.S. Cl.
    CPC ........ *H01L 23/481* (2013.01); *H01L 23/4951* (2013.01); *H01L 25/0657* (2013.01); *H01L 25/105* (2013.01)

(56) References Cited

U.S. PATENT DOCUMENTS

| | | | |
|---|---|---|---|
| 9,535,876 B2 | 1/2017 | Walker | |
| 10,152,262 B2 | 12/2018 | Qawami et al. | |
| 10,394,753 B2 | 8/2019 | Walker | |
| 10,461,076 B1 * | 10/2019 | Brewer | H01L 25/0657 |
| 2008/0168256 A1 | 7/2008 | Wong | |
| 2009/0303767 A1 | 12/2009 | Akerib et al. | |
| 2010/0035454 A1 | 2/2010 | Morgan et al. | |
| 2010/0199017 A1 | 8/2010 | Hollis | |
| 2010/0312999 A1 | 12/2010 | Walker | |
| 2010/0313000 A1 | 12/2010 | Walker | |
| 2012/0265964 A1 | 10/2012 | Murata et al. | |
| 2014/0032459 A1 | 1/2014 | Sinyavskiy et al. | |
| 2014/0136903 A1 | 5/2014 | Hyde et al. | |
| 2014/0172762 A1 | 6/2014 | Suri et al. | |
| 2015/0106574 A1 | 4/2015 | Jayasena et al. | |
| 2015/0194224 A1 | 7/2015 | Jeddeloh | |
| 2015/0356009 A1 | 12/2015 | Wheeler et al. | |
| 2016/0133310 A1 * | 5/2016 | Wilson | G11C 29/023 365/185.18 |
| 2016/0148918 A1 | 5/2016 | Ye et al. | |
| 2016/0266899 A1 | 9/2016 | Tiwari | |
| 2017/0140821 A1 | 5/2017 | Mazed | |
| 2017/0154257 A1 | 6/2017 | Cao et al. | |
| 2017/0168817 A1 | 6/2017 | Walker | |
| 2017/0255390 A1 | 9/2017 | Chang et al. | |
| 2017/0269865 A1 | 9/2017 | Willcock et al. | |
| 2017/0322749 A1 | 11/2017 | Qawami et al. | |
| 2018/0096971 A1 | 4/2018 | Pappu et al. | |
| 2018/0189230 A1 | 7/2018 | Cargnini et al. | |
| 2018/0190353 A1 | 7/2018 | Srinivasan et al. | |
| 2019/0004729 A1 | 1/2019 | Qawami et al. | |
| 2019/0042251 A1 | 2/2019 | Nurvitadhi et al. | |
| 2019/0103160 A1 | 4/2019 | Fang et al. | |
| 2019/0114170 A1 | 4/2019 | Zhang | |
| 2019/0235780 A1 | 8/2019 | DeBenedictis | |
| 2019/0370221 A1 | 12/2019 | Walker | |
| 2019/0378016 A1 * | 12/2019 | John | G06N 3/063 |
| 2020/0117400 A1 | 4/2020 | Golov | |
| 2020/0117449 A1 | 4/2020 | Golov | |
| 2020/0135719 A1 | 4/2020 | Brewer | |

OTHER PUBLICATIONS

International Search Report and Written Opinion, PCT/US2019/056710, dated Feb. 5, 2020.

International Search Report and Written Opinion, PCT/US2019/056810, dated Feb. 5, 2020.

Functional Blocks Implemented by 3d Stacked Integrated Circuit, U.S. Appl. No. 16/169,910, filed Oct. 24, 2018, Tony Brewer, Docketed New Case—Ready for Examination, Dec. 14, 2018.

3d Stacked Integrated Circuits Having Functional Blocks Configured to Accelerate Artificial Neural Network (ann) Computation, U.S. Appl. No. 16/169,919, filed Oct. 24, 2018, Tony Brewer, Docketed New Case—Ready for Examination, Dec. 14, 2018.

Accelerated Access to Computations Results Generated from Data Stored in Memory Devices, U.S. Appl. No. 16/158,558, filed Oct. 12, 2018, Gil Golov, Docketed New Case—Ready for Examination, May 30, 2019.

Parallel Memory Access and Computation in Memory Devices, U.S. Appl. No. 16/158,593, filed Oct. 12, 2018, Gil Golov, Docketed New Case—Ready for Examination, Nov. 19, 2018.

\* cited by examiner

3D STACKED INTEGRATED CIRCUITS HAVING FUNCTIONAL BLOCKS CONFIGURED TO ACCELERATE ARTIFICIAL NEURAL NETWORK (ANN) COMPUTATION

RELATED APPLICATIONS

The present application is a continuation of U.S. patent application Ser. No. 16/169,919, filed Oct. 24, 2018 PAT 10,461,076 B1 and entitled "3D Stacked Integrated Circuits Having Functional Blocks Configured to Accelerate Artificial Neural Network (ANN) Computation", which is hereby incorporated herein by reference.

FIELD OF THE TECHNOLOGY

At least some embodiments disclosed herein relate to artificial neural network (ANN) functional blocks implemented or supported by three-dimensional integrated circuits (3D ICs) in general, and more particularly, but not limited three-dimensional stacked integrated circuits (3D SICs) having functional blocks configured to accelerate or implement artificial neural network (ANN) computation.

BACKGROUND

In general, an artificial neural network (ANN) can use a network of neurons to process inputs to the network and to generate outputs from the network. Each neuron m in the network can receive a set of inputs $p_k$, where k=1, 2, ..., n. In general, some of the inputs to a neuron may be the outputs of certain neurons in the network; and some of the inputs to a neuron may be the inputs to the network as a whole. The input/output relations among the neurons in the network represent the neuron connectivity in the network. Each neuron m can have a bias $b_m$, an activation function $f_m$, and a set of synaptic weights $w_{mk}$ for its inputs $p_k$ respectively, where k=1, 2, ..., n. Different neurons in the network may have different activation functions. Each neuron m can generate a weighted sum $s_m$ of its inputs and its bias, where $s_m = b_m + w_{m1} \times p_1 + w_{m2} \times p_2 + \ldots + w_{mn} \times p_n$. The output $a_m$ of the neuron m can be the activation function of the weighted sum, where $a_m = f_m(s_m)$. The relations between the input(s) and the output(s) of an ANN in general can be defined by an ANN model that includes the data representing the connectivity of the neurons in the network, as well as the bias $b_m$, activation function $f_m$, and synaptic weights $w_{mk}$ of each neuron m. Using a given ANN model a computing device can compute the output(s) of the network from a given set of inputs to the network.

A 3D IC is an integrated circuit built by stacking silicon dies and interconnecting them vertically so that a combination of the dies is a single device. With a 3D IC, electrical paths through the device can be shortened by its vertical layout, which creates a device that can be faster and has a smaller footprint than similar ICs arranged side-by-side. 3D ICs can be generally grouped into 3D SICs, which refers to stacked ICs with through-silicon via interconnects (TSVs), and monolithic 3D ICs, which are generated using fabrication processes to realize 3D interconnects at the local levels of the on-chip wiring hierarchy as set forth by the International Technology Roadmap for Semiconductors (ITRS). Using the fabrication processes to realize the 3D interconnects can produce direct vertical interconnects between device layers. Monolithic 3D ICs are built in layers on a single wafer that is diced into separate 3D ICs.

3D SICs can be produced by three known general methods: a die-to-die, die-to-wafer, or a wafer-to-wafer method. In a die-to-die method, electronic components are generated on multiple dies. Then, the dies are aligned and bonded. A benefit of a die-to-die method is that each die can be tested before aligned and bonded with another die. In a die-to-wafer method, electronic components are generated on multiple wafers. One of the wafers can be diced and then aligned and bonded on to die sites of another wafer, accordingly. In a wafer-to-wafer method, electronic components are generated on multiple wafers, which are then aligned, bonded, and diced into separate 3D ICs.

A TSV is a vertical electrical connection that can pass through a die. TSVs can be a central part to increasing performance in 3D packages and 3D ICs. With TSVs, compared to alternatives for connecting stacked chips, the interconnect and device density can be substantially higher, and the length of the connections can be shorter.

BRIEF DESCRIPTION OF THE DRAWINGS

The embodiments are illustrated by way of example and not limitation in the figures of the accompanying drawings in which like references indicate similar elements.

FIG. 8 also illustrates the example ANN 3D SIC having a plurality of non-volatile memory dies, a volatile memory die, and an ANN processing logic die.

FIG. 10 also shows some hypothetical synapses and neurons implemented by functional blocks of the 3D SIC.

DETAILED DESCRIPTION

Figure 1:
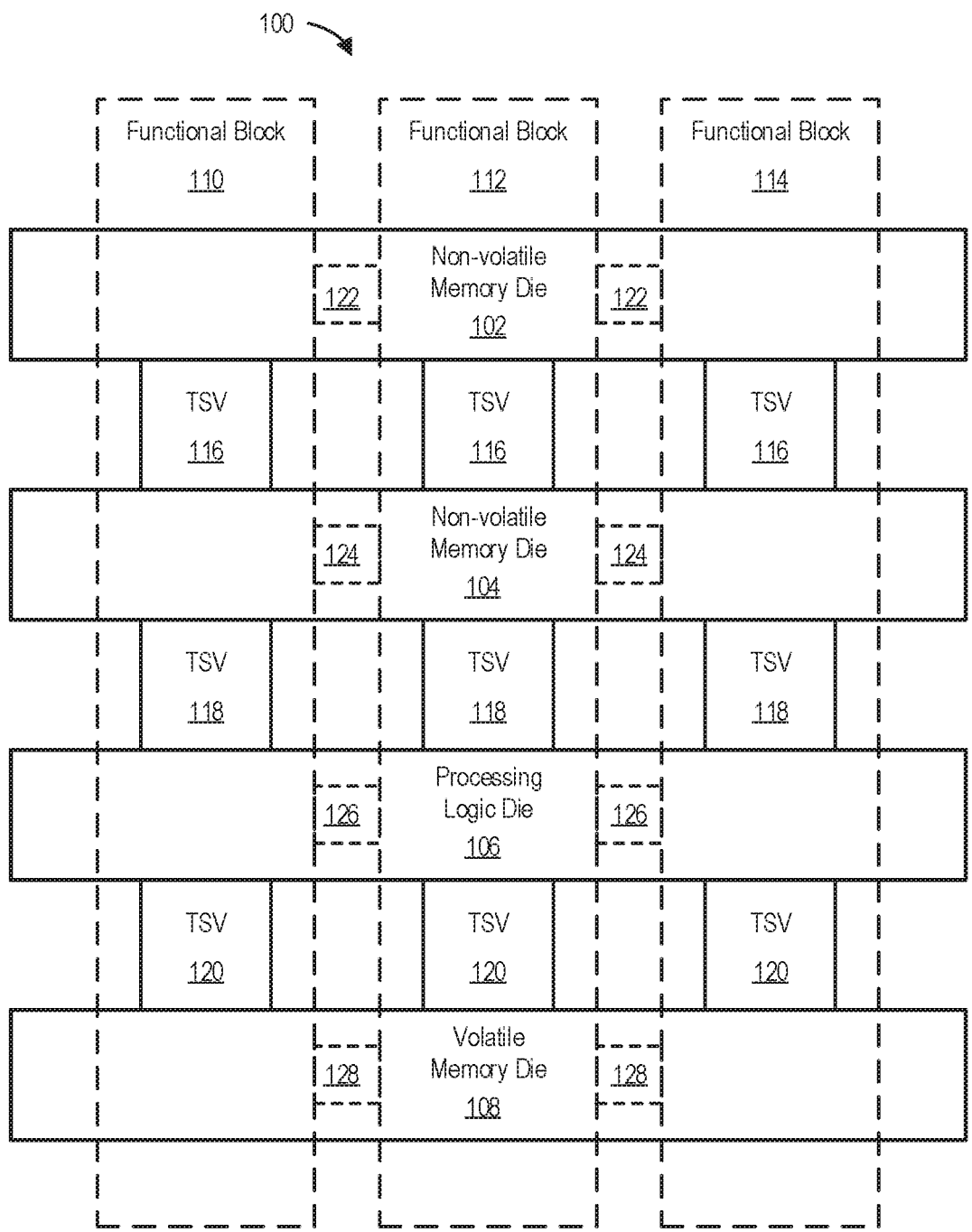
FIG. 1 illustrates a front view of an example 3D SIC having multiple non-volatile memory dies, a volatile memory die, and a processing logic die in accordance with some embodiments of the present disclosure.

At least some aspects of the present disclosure are directed to functional blocks implemented by a 3D SIC. Also, in general, aspects of the present disclosure are directed to functional blocks implemented by a 3D IC.

In general, a 3D IC is an integrated circuit manufactured by stacking silicon wafers or dies and interconnecting them using, for instance, TSVs or Cu—Cu connections, so that they behave as a single device to achieve performance improvements at reduced power and a smaller footprint than conventional two-dimensional devices.

In some embodiments, TSVs can be used, which makes the 3D ICs embodiments that are considered 3D SICs. Embodiments as 3D ICs or as 3D SICs can be created to be heterogeneous, e.g. combining different memory type layers and/or one or more processing layers into a single IC stack. Alternative embodiments of 3D SICs can include monolithic 3D ICs.

Embodiments using monolithic 3D ICs are created in layers on a single semiconductor wafer that is then diced into 3D ICs. These embodiments are advantageous in that there is no need for aligning, thinning, bonding, or TSVs. Although the disclosure herein is mostly focused on 3D SIC embodiments, it is to be understood that the embodiments disclosed herein are not limited to 3D SIC embodiments. Some embodiments can be a monolithic 3D IC instead of a 3D SIC. In such example embodiments, the overall structure of the 3D IC can be similar; however, the interconnects of a monolithic 3D IC includes fabricated vias instead of TSVs.

As for producing 3D SIC embodiments, such embodiments can be generated by a die-to-die, a die-to-wafer, or a wafer-to-wafer production method. In a die-to-die method, thinning and TSV creation may be done before or after bonding in the production method. An example advantage of die-to-die methods is that each component die can be tested before stacking it with other dies. Also, each die can be separately binned for production. In a die-to-wafer method, similar to a wafer-to-wafer method, thinning and TSV creation are performed either before or after bonding. But, an advantage of die-to-wafer over wafer-to-wafer is that additional dies may be added to a stack before dicing, and a die can be tested before adding it to a wafer. In wafer-to-wafer, each wafer may be thinned before or after bonding, and connections are either built into the wafers before bonding or else created in the stack after bonding. With wafer-to-wafer methods, the TSVs can pass through the silicon substrates between active layers and/or between an active layer and an external bond pad. A disadvantage of a wafer-to-wafer method is that a defect in one chip causes a defect in the entire stacked output of the method.

Chip scaling processes are slowly improving in-part because of power-density constraints and interconnects are not becoming faster while transistors are becoming faster in general. 3D ICs address both of these example scaling problems by stacking two-dimensional dies and connecting the dies in a third dimension. Such stacking can possibly make communications between chips faster, compared to a horizontal arrangement of ICs. Also, 3D ICs can provide other possible benefits over horizontally arranging chips, including: a smaller footprint, shorter interconnects, reduced power consumption, circuit security through obscurity, and increased bandwidth.

3D ICs provide greater functionality into a smaller two-dimensional space by taking advantage of adding functionality in layers of a third dimension, and costs can be saved by partitioning a large chip into multiple smaller dies with 3D stacking. To put it another way, the 3D IC manufacturing can be more modular than conventional processes of producing a chip with an array of ICs. Also, 3D ICs can be generated with layers that are created with different processes or different types of wafers, which increases design options. Also, increased connectivity expands design options.

Another advantage is that 3D ICs reduce power consumption by keeping a signal within the device. Shorter electrical connections in two different directions (e.g., horizontally and vertically) also reduce power consumption by producing less parasitic capacitance for example. Reducing the power budget also leads to less heat generation.

Also, 3D ICs can achieve security through obscurity because the stacked die structure complicates attempts to reverse engineer the overall circuitry. Also, sensitive or critical functions can be divided amongst layers of the 3D IC to further conceal such functions. Some embodiments can even have a layer or die dedicated to monitoring or security of the other layers. This is analogous to a firewall layer, where a separate die of the 3D IC provides a hardware firewall for dies to be monitored at runtime. This can be done to protect parts or the entire stack of chips against attacks.

The fundamental structural arrangement of 3D ICs increases bandwidth by allowing large numbers of vias between the dies or layers that in combination can provide much more bandwidth than a conventional bus. Additionally, a set of functional blocks of the 3D SIC can act like a group of separate computers that are networked or clustered. Different functional blocks can have different types of processing units. And, the different types of functional blocks can be complimentary. And, the more related a functional block is to another block the more beneficial it is to locate two functional blocks next to each other. For example, a first block can provide a first data processing operation and a neighboring second block can provide a second data processing operation in a common multiple operation data processing method. Such features can greatly reduce the load of a controller of computerized system. For instance, such features can reduce the load of a central processing unit (CPU).

In embodiments where the blocks are implemented by a 3D SIC, the use of TSVs can make it advantageous to reduce each functional block to one function so that the benefits of TSVs are fully realized. In such embodiments, the functionality of the 3D IC can be increased by increasing the number of functional blocks in the 3D IC and not the number of functions that a single functional block can perform. This way, the TSV or another type of interconnect of a 3D SIC can be used to its full potential.

A TSV is an electrical connection that can pass completely through a silicon wafer or die. With TSVs, interconnections and device density is substantially higher than with conventional interconnections between die. And, length of the connections between die is shorter than conventional interconnections.

Some embodiments can have TSVs added to the 3D IC structure via-first TSV fabrication. This is a process where the TSVs are fabricated before the components, e.g., transistors, capacitors, and resistors, are patterned onto the wafer. Some embodiments use via-middle TSV fabrication where TSVs are fabricated after the individual devices are patterned but before the metal layers are added to a die or a stack of dies. And, some embodiments use via-last TSV fabrication where TSVs are fabricated after or during the addition of metal layers.

In addition to the way in which TSVs are added to the 3D IC, the layout and design of the TSVs can vary between embodiments described herein. For example, differences in partitioning granularity of functional elements of the dies of the 3D IC can cause variation in the design and layout of TSVs. Some embodiments have gate level partitioning using TSVs and other embodiments have block level partitioning. Gate level partitioning using TSVs is less practical than block level partitioning; thus, to increase the benefit of having more TSVs, functional sub-elements partitioned within a functional block can be connected via TSVs. This can be a middle ground solution.

In some embodiments, a stack of chips or die (stacked in a first direction) can have a processing logic integrated circuit (IC), in addition to memory ICs, such as 3D XPoint memory (3DXP) and dynamic random access memory (DRAM) ICs. Units of processing logic, 3DXP and DRAM can be connected to form a functional block, such as by TSVs. Different functional blocks can be configured differently on demand and/or operate substantially independently from each other in one 3D SIC or, in general, in one 3D IC. The processing logic implements frequently used functions and/or data intensive functions, such that even though the processing logic IC may not have the processing power of a CPU, its advantage in better data access can provide a better overall performance in implementing selected functions. Multiple functional blocks (e.g., multiple column functional blocks within a 3D SIC or 3D IC) can run in parallel and reduce the computation load on the CPU.

As mentioned, in some embodiments, the processing logic IC or die does not have a full array of processing cores that a typical CPU would have. But, in such embodiments, the processing logic implements frequently used functions and/or data intensive functions; thus, having potential to relieve the CPU of significant processing duties and enhancing the performance of the CPU. In such embodiments, a functional block cannot execute a complete set of multi-functional instructions on its own. Therefore, the functional block and the remainder of the 3D IC can be connected to a CPU, and the CPU may instruct the function block to do a task it is configured to do. For example, a functional block of example embodiments can be configured to decrypt, by its processing logic IC, the data stored in its non-volatile memory IC, and insert the decrypted data into its volatile memory to be communicated to the CPU for further processing by CPU. Also, the CPU can provide a request to the volatile memory of a functional block to request the block to generate a result of a certain function, and the CPU can also provide a follow-up request to retrieve the result from the functional block. For instance, the request for generation of the result can be provided from the CPU to the functional block in the form of a write command, and the request to retrieve the result can be provided from the CPU to the functional block in the form of a read command.

FIG. 1 illustrates a front view of a 3D SIC 100 having multiple non-volatile memory dies 102 and 104, a volatile memory die 108, and a processing logic die 106 in accordance with some embodiments of the present disclosure. As shown, the dies are parallel to each other. The 3D SIC 100 also has functional blocks 110, 112, and 114 (as shown in FIG. 1) as well as functional blocks 210, 212, 214, 220, 222, and 224 (as shown in FIGS. 2-5) that traverse and are perpendicular to the multiple non-volatile memory dies 102 and 104, the volatile memory die 108, and the processing logic die 106. The 3D SIC 100 also has TSVs 116, TSVs 118, and TSVs 120 that connect the dies respectively. TSVs 116 are shown in between and connecting the non-volatile memory die 102 to the non-volatile memory die 104. TSVs 118 are shown in between and connecting the non-volatile memory die 104 to the processing logic die 106. TSVs 120 are shown in between and connecting the processing logic die 106 to the volatile memory die 108. It is to be understood that all the TSVs described herein pass through the dies described herein even thought this may not be clear from the drawings. For example, TSVs 116, TSVs 118, and TSVs 120 are parts of single TSVs passing through the dies of the 3D SIC 100.

The 3D SIC 100 also has interconnects 122, 124, 126, and 128, which are shown as embedded in the dies respectively. Interconnects 122 are shown embedded in the non-volatile memory dies 102. Interconnects 124 are shown embedded in the non-volatile memory dies 104. Interconnects 126 are shown embedded in the processing logic die 106. And, interconnects 128 are shown embedded in the volatile memory die 108. The interconnects 122, 124, 126, and 128 can be perpendicular to the TSVs 116, 118, and 120 (as shown in FIG. 1 and as shown partially in FIG. 5).

It is to be understood that interconnects described herein, such as interconnects 122, 124, 126, and 128, refer to interconnections between components of a chip or die (e.g., copper or metal interconnects, interconnect traces, etc.). The interconnects can include interconnects in the metallization layer of a die or chip.

As depicted, in some embodiments, a 3D SIC can have multiple non-volatile memory dies. In some embodiments, the non-volatile memory dies are slower than the volatile memory dies. Specifically, the non-volatile memory dies have less bandwidth (e.g., the maximum amount of data the die can transfer each second) than the volatile memory dies. The non-volatile memory dies can include 3DXP dies or any other type of electrically addressed memory system die, e.g., a EPROM die, flash memory die, ferroelectric RAM, and magnetoresistive RAM. Each non-volatile memory die can have an array of non-volatile memory partitions. Each partition of the array of non-volatile memory partitions can include an array of non-volatile memory cells and each cell can have a corresponding address.

Figure 2:
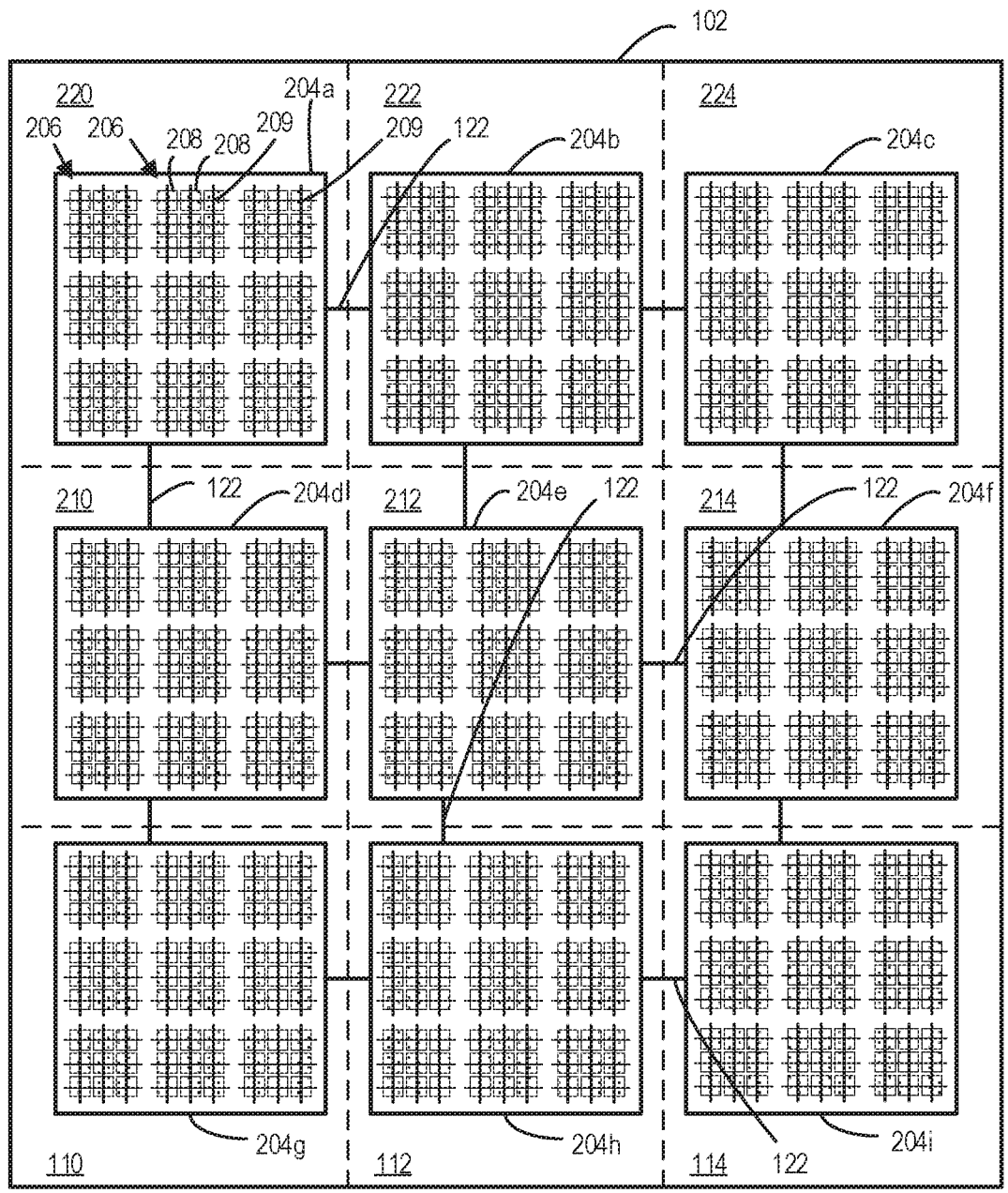
FIG. 2 illustrates a top view of an example non-volatile memory die having multiple non-volatile memory partitions (each partition having multiple non-volatile memory elements) in accordance with some embodiments of the present disclosure.

FIG. 2 illustrates a top view of the non-volatile memory die 102 having multiple non-volatile memory partitions 204a, 204b, 204c, 204d, 204e, 204f, 204g, 204h, and 204i in accordance with some embodiments of the present disclosure. The partitions can be arranged in a second direction (i.e., perpendicular to the first direction of the stacking of the dies of the 3D IC). Each of the partitions 204a, 204b, 204c, 204d, 204e, 204f, 204g, 204h, and 204i has multiple non-volatile memory elements. Each of the partitions illustrated in FIG. 2 shows nine non-volatile memory element clusters 206. And, each of the non-volatile memory element clusters 206 shows nine non-volatile memory elements 208. Thus, each of the partitions illustrated in FIG. 2 has eighty-one memory elements 208. However, it is to be understood that the depiction of eighty-one memory elements is for convenience sake and that in some embodiments each partition could have up to at least a billion memory elements. To put it another way, the number of memory elements per non-volatile memory partition can be enormous and vary greatly. Also, it is to be understood that non-volatile memory die 102 and non-volatile memory die 104 are similar or exactly the same with respect to structure and design.

A 3DXP IC (also known as a 3D XPoint memory IC) uses transistor-less memory elements, each of which has a memory cell and a corresponding address (as well as an optional selector and the cell and optional selector can be stacked together as a column). In examples with memory elements, the memory elements can be connected via two perpendicular layers of interconnects (as shown but not labeled in FIG. 2), where one layer is above the memory elements and the other layer is below the memory elements. Each memory element can be individually selected at a cross point of one wire on each of the two layers of interconnects (e.g., see cross point 209 shown in FIG. 2). Each cross point has an address or is addressable or selectable such as by an address decoder of the 3DXP IC, the 3D IC, or a group of ICs of the 3D IC. 3DXP devices are fast and non-volatile and can be used as a unified memory pool for processing and storage.

As mentioned, the non-volatile memory dies 102 and 104 can be 3DXP dies. Some advantages of using a 3DXP die as the non-volatile memory die of the 3D SIC 100 include that it is bit addressable by an address decoder. An address decoder (not shown in the drawings) used with an embodiment described herein can be a binary decoder that has two or more inputs for address bits and one or more outputs for device selection signals. When the address for a particular device or IC appears on the address inputs, the decoder asserts the selection output for that device or IC. A dedicated, single-output address decoder can be incorporated into each device or IC on an address bus, or a single address decoder can serve multiple devices or ICs.

Also, the 3D SIC can have a volatile memory die (such as a DRAM die or a static random access memory (SRAM) die) including an array of volatile memory partitions. Each partition of the array of volatile memory partitions can include an array of volatile memory cells and each cell can have a corresponding address.

Figure 3:
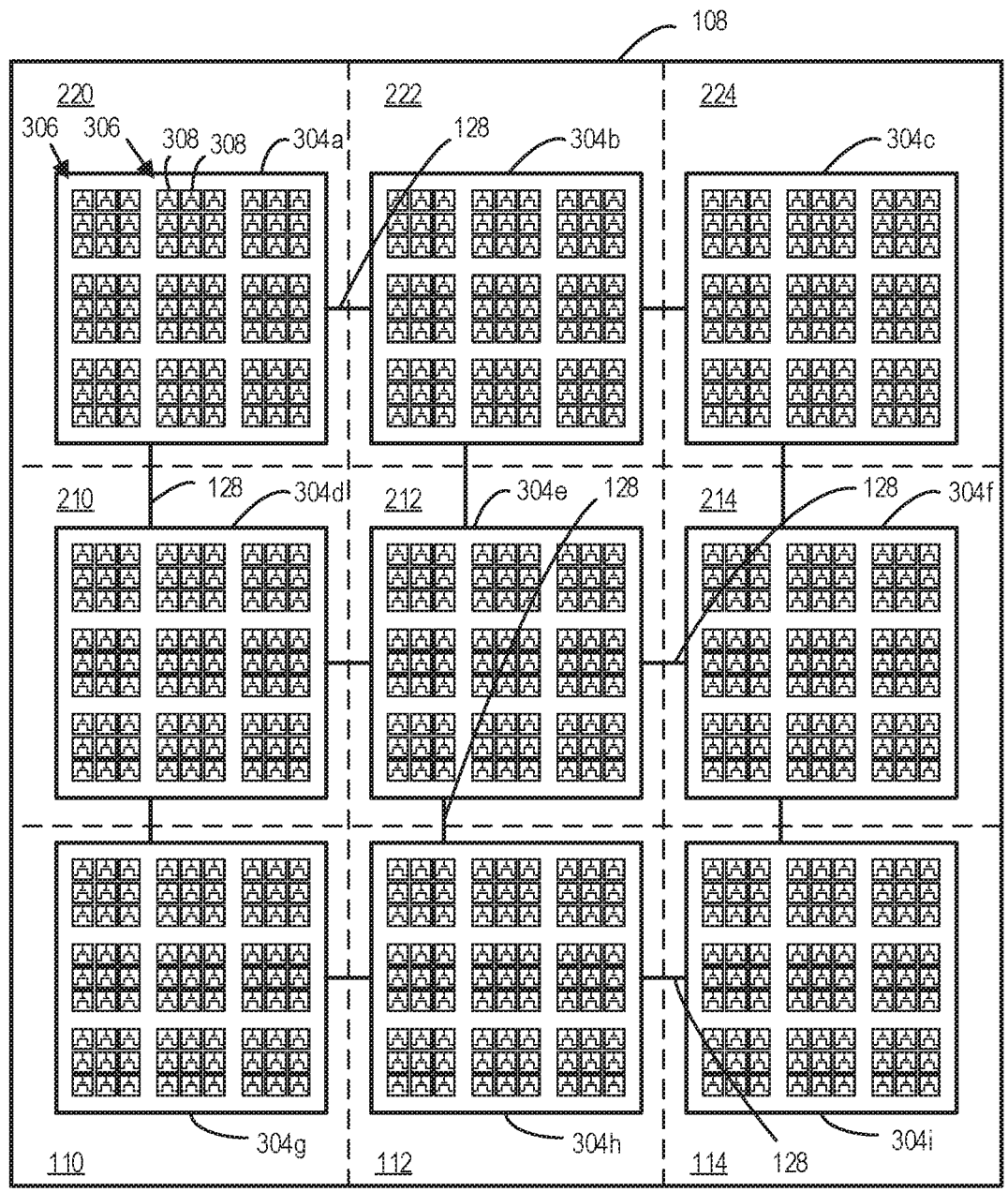
FIG. 3 illustrates a top view of an example volatile memory die having multiple volatile memory partitions (each partition having multiple volatile memory elements) in accordance with some embodiments of the present disclosure.

FIG. 3 illustrates a top view of the volatile memory die 108 having multiple volatile memory partitions 304a, 304b, 304c, 304d, 304e, 304f, 304g, 304h, and 304i in accordance with some embodiments of the present disclosure. The partitions can be arranged in second direction (i.e., perpendicular to the direction of the stacking of the dies of the 3D IC). Each of the partitions 304a, 304b, 304c, 304d, 304e, 304f, 304g, 304h, and 304i has multiple volatile memory elements. Each of the partitions illustrated in FIG. 3 shows nine volatile memory element clusters 306. And, each of the volatile memory element clusters 306 shows nine volatile memory elements 308. Thus, each of the partitions illustrated in FIG. 3 has eighty-one memory elements 308. However, it is to be understood that the depiction of eighty-one memory elements is for convenience sake and that in some embodiments each partition could have up to at least a billion memory elements. To put it another way, the number of memory elements per volatile memory partition can be enormous and vary greatly.

The 3D SIC can also have a processing logic die having an array of processing logic partitions. Each partition can have a separate field-programmable gate array (FPGA) or another type of processing logic device. The processing logic die can include a controller unit and an arithmetic/logic unit. For instance, the arithmetic/logic unit can include an FPGA.

Figure 4:
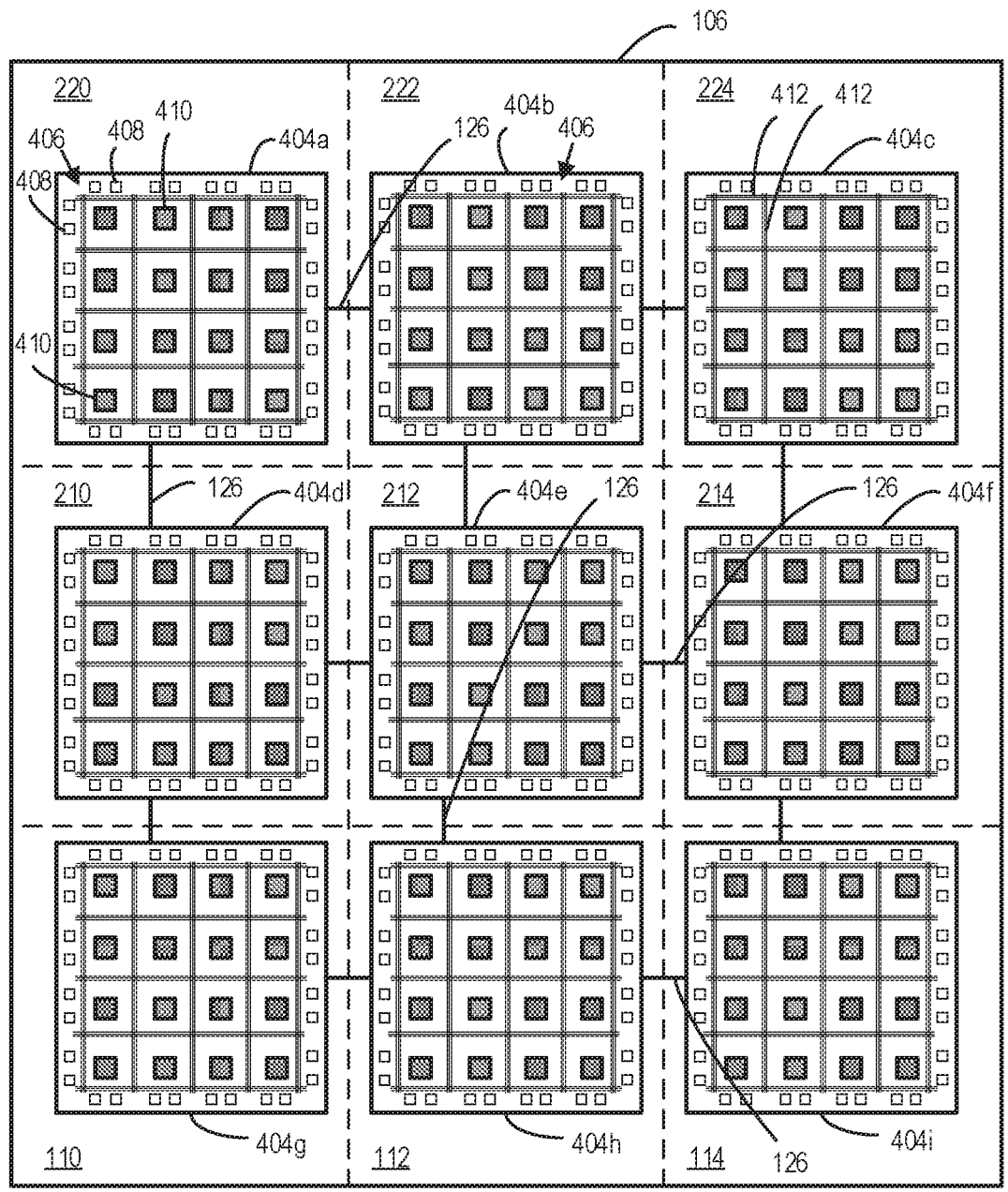
FIG. 4 illustrates a top view of an example processing logic die having multiple processing logic partitions (each partition having a separate field-programmable gate array) in accordance with some embodiments of the present disclosure.

FIG. 4 illustrates a top view of the processing logic die 106 having multiple processing logic partitions 404a, 404b, 404c, 404d, 404e, 404f, 404g, 404h, and 404i in accordance with some embodiments of the present disclosure. FIG. 4 shows each of the partitions 404a, 404b, 404c, 404d, 404e, 404f, 404g, 404h, and 404i having a separate FPGA 406. As shown, each of the nine FPGAs 406 illustrated in FIG. 4 has thirty-two input/output blocks 408 and sixteen logic blocks 410. Also, FIG. 4 shows programable or non-programable interconnects 412 between the input/output blocks 408 and the logic blocks 410 of each of the nine FPGAs 406. It is to be understood that the depiction of the amount of input/output units and logic units of an FPGA 406 is for convenience sake and that in some embodiments each FPGA of a partition could have more or less input/output units and logic units depending on the embodiment of the corresponding functional block. Also, even though FIG. 4 shows one FPGA per partition, it is to be understood that each processing logic partition can have multiple FPGAs in other embodiments of the 3D SIC or the processing logic die. To put it another way, the number of specific parts of the processing logic die can vary greatly.

FIGS. 2, 3, and 4 also show the functional blocks 110, 112, 114, 210, 212, 214, 220, 222, and 224 of the 3D SIC 100. FIG. 2 shows a top view of respective sections of the functional blocks at the non-volatile memory die 102. FIG. 3 shows a top view of respective sections of the functional blocks at the volatile memory die 108. FIG. 4 shows a top view of respective sections of the functional blocks at the processing logic die 106.

FIGS. 2, 3, and 4 also show the interconnects 122, 128, and 126 interconnecting the non-volatile memory partitions, the volatile memory partitions, and the processing logic partitions respectively. Thus, the interconnects 122, 128, and 126 are also shown interconnecting the functional blocks of the 3D SIC 100 at each layer of the 3D SIC. Specifically, as shown in FIG. 2, the interconnects 122 interconnect the non-volatile memory partitions 204a, 204b, 204c, 204d, 204e, 204f, 204g, 204h, and 204i of the non-volatile memory die 102. As shown in FIG. 3, the interconnects 128 interconnect the volatile memory partitions 304a, 304b, 304c, 304d, 304e, 304f, 304g, 304h, and 304i of the volatile memory die 108. And, as shown in FIG. 4, the interconnects 126 interconnect the processing logic partitions 404a, 404b, 404c, 404d, 404e, 404f, 404g, 404h, and 404i of the processing logic die 106.

In the 3D SIC, the non-volatile memory die, the volatile memory die, and the processing logic die are stacked in a first direction (e.g., vertically), and the processing logic die can be stacked in between the non-volatile memory die and the volatile memory die. The 3D SIC can also have an array of functional blocks which are made up from the dies of the 3D SIC. To put it another way, the non-volatile memory die, the volatile memory die, and the processing logic die are arranged to form the array of functional blocks. At least two functional blocks of the array of functional blocks each can include a different data processing function that reduces the computation load of a controller—such reducing the computational load of a CPU. Each functional block of the array of functional blocks can include a respective column of the 3D SIC. A respective column of the 3D SIC can include a respective non-volatile memory partition of the array of non-volatile memory partitions, a respective volatile memory partition of the array of volatile memory partitions, and a respective processing logic partition of the array of processing logic partitions. A respective processing logic partition can be stacked in the first direction in between a respective non-volatile memory partition and a respective volatile memory partition.

Figure 5:
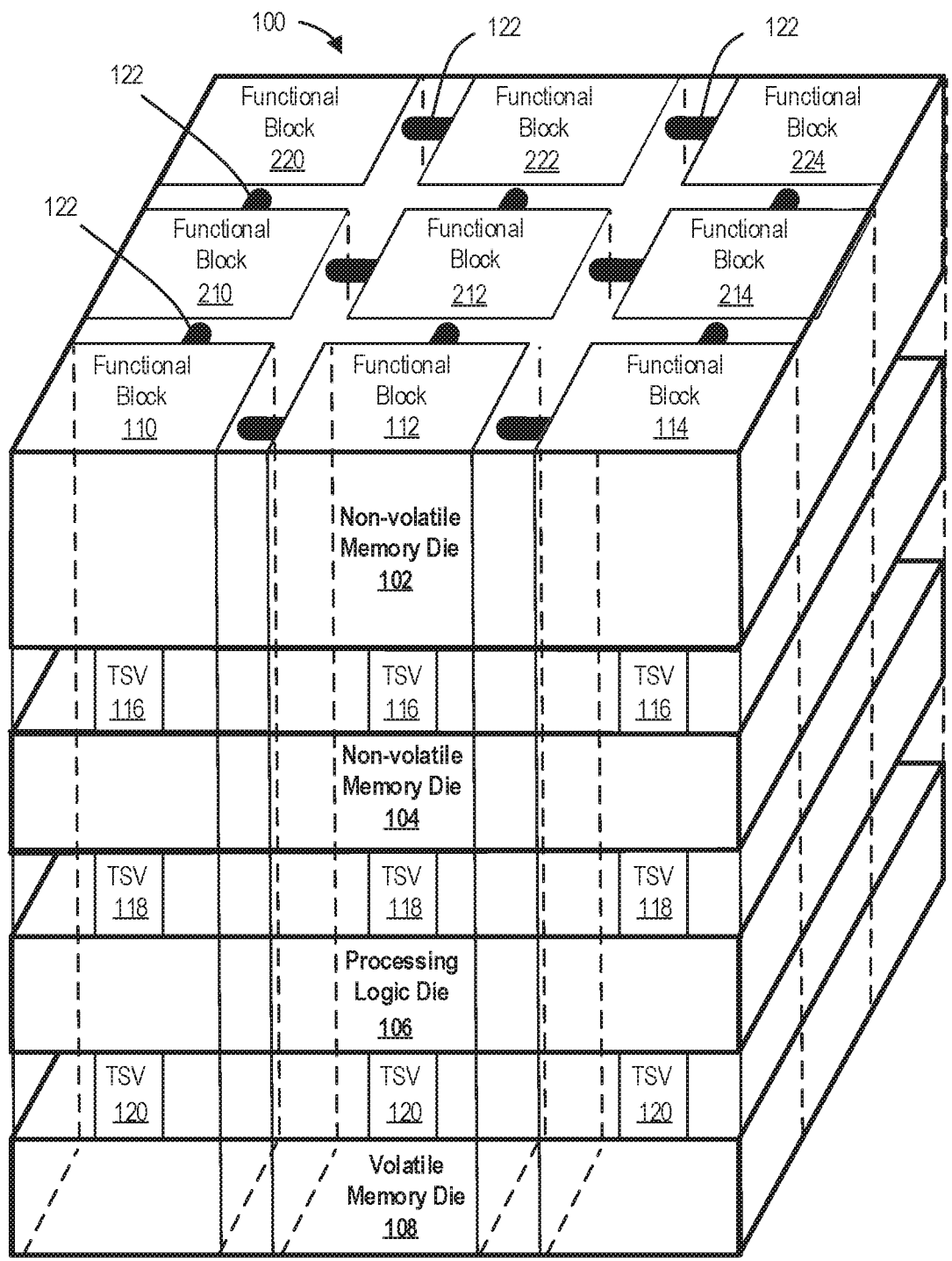
FIG. 5 illustrates a perspective view of the example 3D SIC illustrated in FIG. 1 having multiple non-volatile memory dies, a volatile memory die, and a processing logic die in accordance with some embodiments of the present disclosure.

FIG. 5 illustrates a perspective view of the 3D SIC 100 illustrated in FIG. 1 having multiple non-volatile memory dies 102 and 104, volatile memory die 108, and processing logic die 106 in accordance with some embodiments of the present disclosure. FIG. 5 shows perspective views of the non-volatile memory dies 102 and 104, the volatile memory die 108, and the processing logic die 106 and how the dies are stacked in a first direction (e.g., vertically), and how the processing logic die can be stacked in between the non-volatile memory dies and the volatile memory die. FIG. 5 also shows the array of functional blocks completely in that all the functional blocks 110, 112, 114, 210, 212, 214, 220, 222, and 224 of the 3D SIC 100 are depicted.

It is to be understood that the number of functional blocks of a 3D SIC can vary depending on the embodiment of the 3D SIC. Each functional block of the array of functional blocks illustrated in FIGS. 1-5 can include a respective column of the 3D SIC 100, as shown. And, as shown by the combination of FIGS. 1-5, a column of the 3D SIC, having a single functional block, can include a respective non-volatile memory partition of the array of non-volatile memory partitions, a respective volatile memory partition of the array of volatile memory partitions, and a respective processing logic partition of the array of processing logic partitions. Also, shown by the combination of these drawings, a respective processing logic partition can be stacked in a first direction (e.g., vertically) in between a respective non-volatile memory partition and a respective volatile memory partition.

In some embodiments, each of two abutting functional blocks of the array of functional blocks can have different particular data processing functions that are commonly used together for a greater particular data processing function. Particular data processing functions can include fundamental processes of a CPU, such as decoding processes of a decode operation of CPU.

Embodiments of the 3D IC or at least a group of functional blocks of some embodiments can function as an instruction decoder for a CPU. This way the CPU can reserve resources for fetching and execution operations, when connected to such embodiments of the 3D IC.

Particular data processing functions can also include functions of an arithmetic logic unit of a CPU, such as integer arithmetic and bitwise logic operations. This way the CPU can reserve resources by delegating arithmetic logic unit operations to such embodiments of the 3D IC.

Also, embodiments of the 3D IC or at least a group of functional blocks of some embodiments can function as different types of encoders and/or decoders besides those usually hardwired or programmed into a CPU. For example, embodiments of the 3D IC or at least a group of functional blocks of some embodiments can function as an encryption block wherein the 3D IC or at least a group of functional blocks have a cipher that can generate a ciphertext. Also, embodiments can function as a decryption block. In one embodiment, one or more blocks of the 3D IC can be dedicated to encryption and other one or more blocks of the same 3D IC can be dedicated to decryption. Also, embodiments of the 3D IC or at least a group of functional blocks of some embodiments can function as one or more data processing intensive operations, such as data intensive operations of a type of machine learning.

The 3D SIC can also include a first set of TSVs that connect the respective non-volatile memory partition and the respective processing logic partition in the respective column of the 3D SIC (e.g., TSVs 118 as shown in FIGS. 1 and 5) as well as a second set of TSVs that connect the respective volatile memory partition and the respective processing logic partition in the respective column of the 3D SIC (e.g., TSVs 120 as shown in FIGS. 1 and 5).

In some embodiments, processing logic die can include a control unit and an arithmetic/logic unit, and each of the memory ICs can include storage parts that are addressable by an address decoder and/or have predefined addresses. In such embodiments, the control unit is connected in a first direction (e.g., vertically) with the storage parts of the memory ICs and the arithmetic/logic unit is connected in the first direction with the storage parts of the memory ICs and/or the parts of the IC are connected to the storages parts of the memory ICs via an address decoder.

In some embodiments including the control unit and the arithmetic/logic unit, the control unit is configured to, during an instruction time, get instructions from the volatile memory IC of the 3D IC and decode the instructions and direct data to be moved from the volatile memory IC to the arithmetic/logic unit according to at least part of the instructions. And, the arithmetic/logic unit can be configured to, during an execution time, execute the at least part of the instructions and store a result of the execution of the at least part of the instructions in a non-volatile memory IC of the 3D IC.

In such embodiments, the arithmetic/logic unit is given control and performs the actual operation on the data. The combination of instruction time and execution time can be a machine cycle of the 3D IC, and in some embodiments, the control unit can direct, during the execution time, the volatile memory IC and/or the non-volatile memory IC to release the result to an output device or a storage device external of the apparatus. In some embodiments, connections between the control and arithmetic/logic units and the memory units of the memory ICs are connections that can be TSVs. To put it another way, the control unit can be connected in a first direction (e.g., vertically), by a plurality of electrical connections, with the memory elements of the memory ICs and the arithmetic/logic unit is connected, by a plurality of electrical connections, with the memory elements of the memory ICs.

The memory cells and logic units of each IC or die of the 3D IC can be connected to each other by a plurality of electrical connections. For example, the 3D SIC can also include a first set of interconnects that connect non-volatile memory partitions of the array of non-volatile memory partitions in a second direction that is orthogonal to the first direction (e.g., a horizontal direction), e.g., interconnects 122 as shown in FIGS. 1 and 2, a second set of interconnects that connect volatile memory partitions of the array of volatile memory partitions in the second direction, e.g., interconnects 128 as shown in FIGS. 1 and 3, and a third set of interconnects that connect processing logic partitions of the array of processing logic partitions in the second direction, e.g., interconnects 126 as shown in FIGS. 1 and 4. In some embodiments having the three sets of interconnects, a interconnect of the first set of interconnects only connects a non-volatile memory partition of the array of non-volatile memory partitions to another non-volatile memory partition directly next to the non-volatile memory partition (e.g., see interconnects 122 as shown in FIGS. 1 and 2). Also, in such embodiments, an interconnect of the second set of interconnects only connects a volatile memory partition of the array of volatile memory partitions to another volatile memory partition directly next to the volatile memory partition (e.g., see interconnects 128 as shown in FIGS. 1 and 3). And, an interconnect of the third set of interconnects only connects a processing logic partition of the array of processing logic partitions to another processing logic partition directly next to the processing logic partition (e.g., see interconnects 126 as shown in FIGS. 1 and 4).

Some exemplary embodiments of the 3D SIC includes a processing logic die, a 3DXP die, and a DRAM die, with the processing logic die being stacked between the 3DXP die and the DRAM die. In such exemplary embodiments, a set of TSVs interconnect the processing logic die, the 3DXP die, and the DRAM die. In such exemplary embodiments or some other exemplary embodiments, the 3D SIC includes a 3DXP die having an array of non-volatile memory partitions, with each partition of the array of non-volatile memory partitions having an array of non-volatile memory cells. In such embodiments, a volatile memory die has an array of volatile memory partitions, with each partition of the array of volatile memory partitions having an array of volatile memory cells. Also, in such embodiments, a processing logic die is included and has an array of processing logic partitions. And, the 3DXP die, the volatile memory die, and the processing logic die are stacked in a first direction (e.g., vertically) with the processing logic die stacked in between the 3DXP die and the volatile memory die. Further, such embodiments of the 3D SIP can include a first set of TSVs that connect, in the first direction, a respective non-volatile memory partition and a respective processing logic partition in a respective column of the 3D SIC. And, such embodiments can include a second set of TSVs that connect, in the first direction, a respective volatile memory partition and the respective processing logic partition in the respective column of the 3D SIC.

The 3D SIC can also have multiple non-volatile memory dies (as shown in FIGS. 1 and 5). For example, the 3D SIC can include a second non-volatile memory die can include a second array of non-volatile memory partitions. And, each partition of the second array of non-volatile memory partitions can have an array of non-volatile memory cells. In embodiments where the 3D SIC has multiple non-volatile memory dies, the non-volatile memory dies (such as the first and second non-volatile memory dies) can be grouped together such that the processing logic die is in between the volatile memory die and the group of non-volatile memory dies (as shown in FIGS. 1 and 5).

In some embodiments of the 3D SIC, each functional block the 3D SIC can have a respective communications interface (i.e., a respect port) configured to communicatively couple the block to a bus so that each block can operate in parallel and independently of the other. Additionally or alternatively, groups of at least two functional blocks of the 3D SIC each share a respective communications interface configured to communicatively couple the at least two functional blocks to a bus, so that each group of at least two functional blocks can operate in parallel and independently of another group of at least two functional blocks. Additionally, or alternatively, the 3D SIC can have one or more universal communications interfaces (i.e., one or more universal ports) configured to communicatively couple any one or all of the functional blocks of the 3D SIC to a bus.

Figure 6:
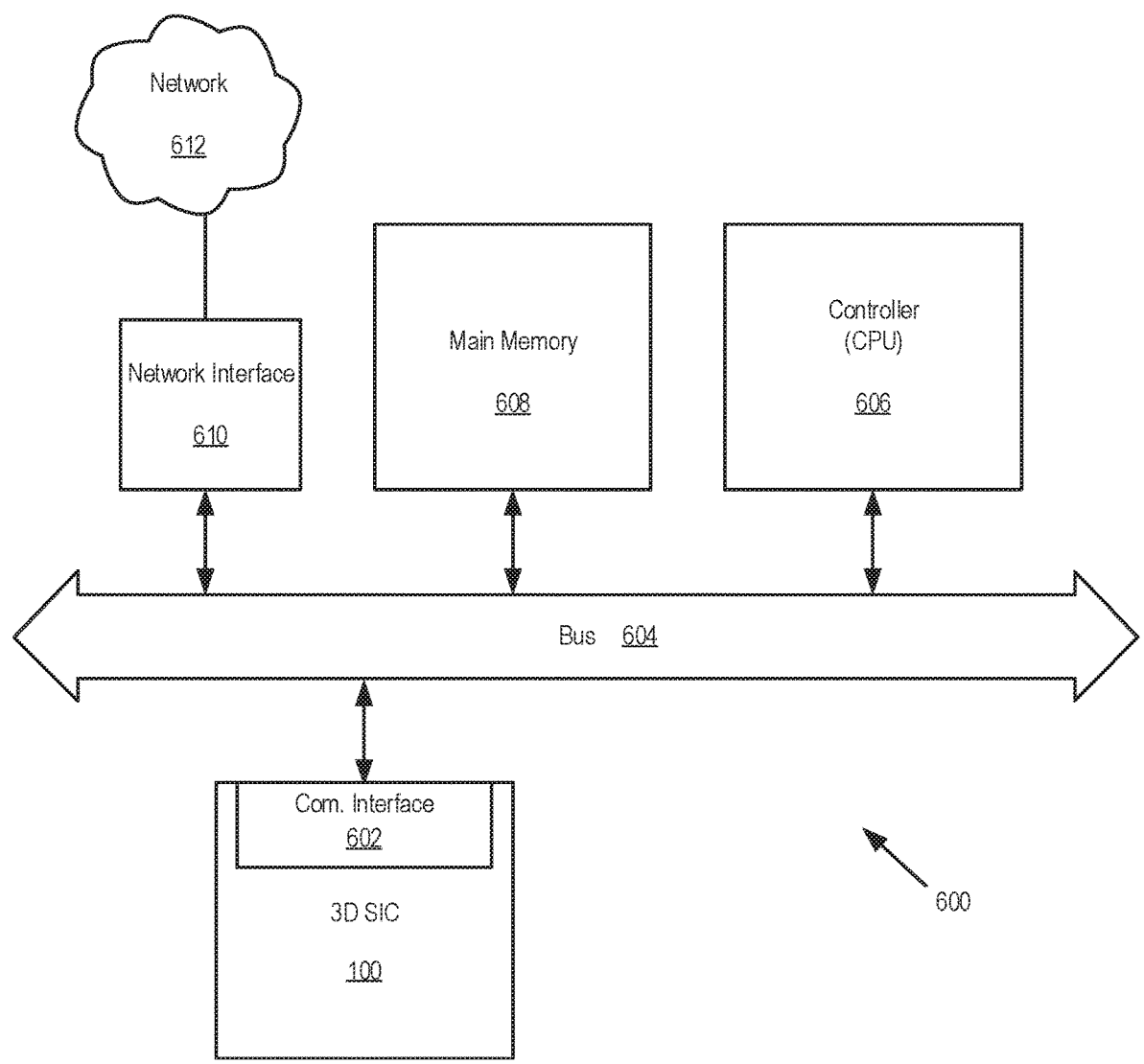
FIG. 6 illustrates a block diagram of an example computer system in which embodiments of the present disclosure can operate.

FIG. 6 illustrates a block diagram of an example computer system 600 in which embodiments of the present disclosure can operate. As shown in FIG. 6, the computer system 600 includes the 3D SIC 100 that includes a communications interface 602 (or also referred to as port 602). The communications interface 602 is communicatively coupled to a bus 604 of the computer system 600. The bus 604 is communicatively coupled to a controller of the computer system 600 (e.g., a CPU of the system 600) as well as a main memory 608 and network interface 610 of the computer system 600. As shown in FIG. 6, the network interface 610 communicatively couples the computer system 600 to a computer network 612.

The computer system 600 can be or include a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that computerized system. Further, while a single computer system 600 is illustrated, the term "computer system" shall also be taken to include any collection of computer systems. The bus 604 can be or include multiple buses. The controller 606 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Controller 606 can also be one or more special-purpose processing devices such as an application specific integrated circuit (ASIC), an FPGA, a digital signal processor (DSP), network processor, or the like. The main memory 608 can be a read-only memory (ROM), flash memory, DRAM such as synchronous DRAM (SDRAM) or Rambus DRAM (RDRAM), and/or SRAM.

Referring to FIGS. 1 and 6, in some embodiments, the port 602 can be configured to communicatively couple the volatile memory die 108 to the bus 604. In such an arrangement, the controller 606 can delegate data processing functions to the 3D SIC 100 via the bus 604 and the volatile memory die 108. The delegated data processing functions can be data intensive functions or commonly used functions of the controller 606. As mentioned, in some embodiments, the processing logic IC or die does not have a full array of processing cores that a typical CPU would have. But, in such embodiments, the processing logic can implement frequently used functions and/or data intensive functions; thus, having potential to relieve the CPU of significant processing duties and enhancing the performance of the CPU. Also, in the depicted embodiments, a functional block cannot execute complete set of multifunctional instructions on its own. Therefore, a functional block and the remainder of the 3D SIC 100 can be connected to a controller (such as a CPU) and the controller can instruct the function block to do a task it is configured to do.

For example, a functional block of example embodiments can be configured to decrypt, by its processing logic partition, the data stored in its corresponding non-volatile memory partition, and insert the decrypted data into its corresponding volatile partition to be communicated to the controller for further processing by controller.

Also, in general, the controller can provide a request to the volatile memory partition of a functional block to request the block to generate a result of a certain function, and the controller can also provide a second or follow-up request to retrieve the result from the functional block. For instance, the request for generation of the result can be provided from the controller to the functional block in the form of a write command, and the request to retrieve the result can be provided from the controller to the functional block in the form of a read command.

Figure 7:
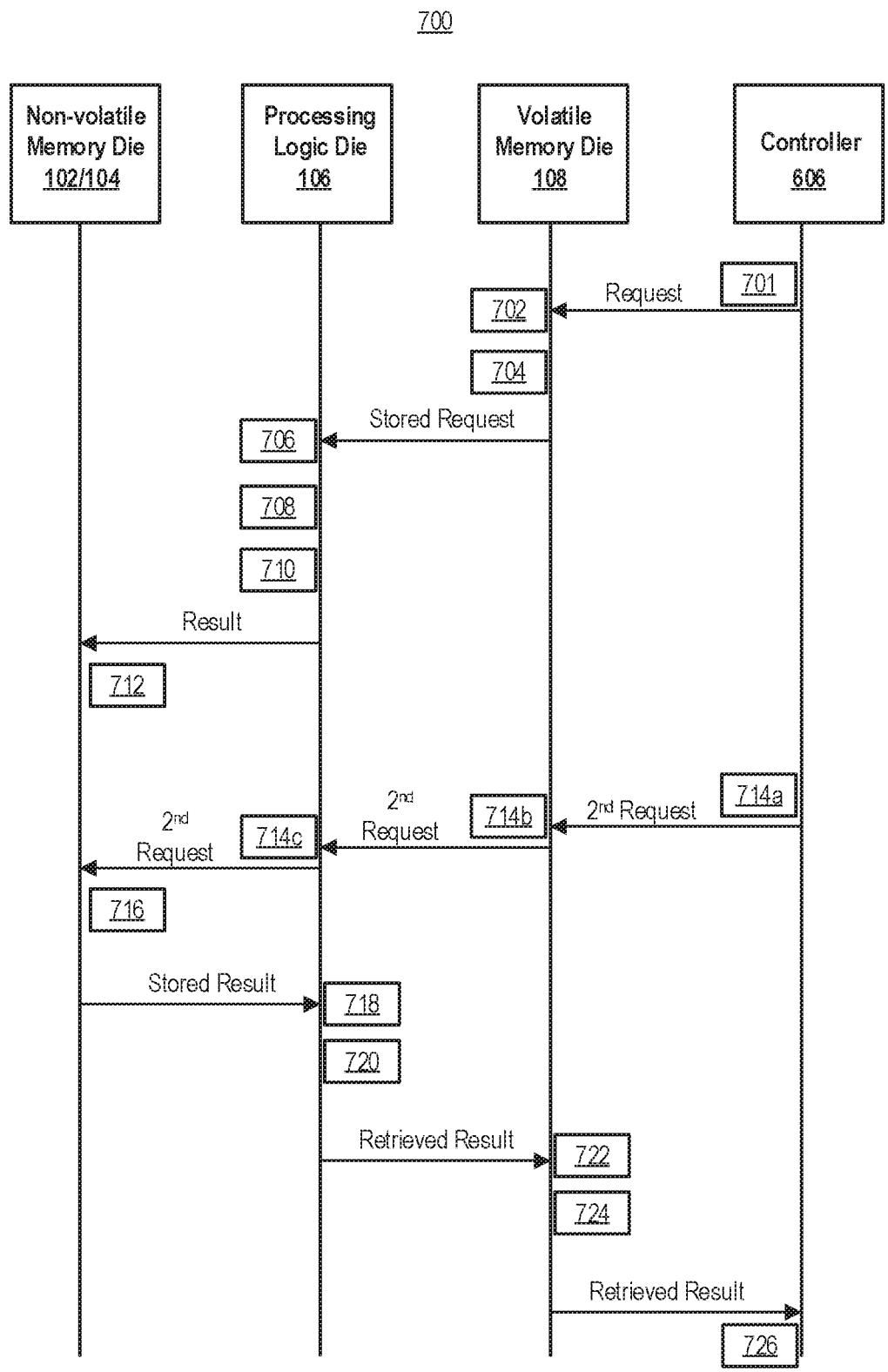
FIG. 7 illustrates a flow diagram of an example method in which embodiments of the present disclosure can perform along with a controller.

FIG. 7 illustrates a flow diagram of an example method 700 in which embodiments of the 3D SIC (e.g., 3D SIC 100 of FIGS. 1-6) can interact with a controller (e.g., controller 606 of FIG. 6) via a bus (e.g., bus 604 of FIG. 6).

The method 700 in general can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. Although shown in a particular sequence or order and performed by particular hardware/software, unless otherwise specified, the order and hardware/software of the processes can be modified. Thus, the illustrated embodiments should be understood only as examples, and the illustrated processes can be performed in a different order and/or by different hardware/software, and some processes can be performed in parallel. Additionally, one or more processes can be omitted in various embodiments. Thus, not all processes are required in every embodiment. Other process flows are possible as well.

Specifically, the method 700 can be performed by at least the non-volatile memory die 102 and/or the non-volatile memory die 104, the processing logic die 106, the volatile memory die 108, and the controller 606 (as illustrated in FIG. 7). At block 701, the controller 606 communicates a request, via a bus. The request of the controller 606 is configured to instruct the 3D SIC to generate a result of a particular data processing function. Such a request can be delivered to the 3D SIC via a write command of the controller 606. For example, if a write command is used by the controller 606 to make the request, then the request is sent to the selected volatile memory partition of the volatile memory die 108. Alternatively, an execute command can be used by the controller 606 to make the request, and in such instances the request can be directly sent to the selected processing logic partition of the processing logic die 106.

At block 702, the volatile memory die 108 receives the request via the bus. The volatile memory die 108 can be configured to receive, from the bus through the port 602, the request of the controller. In addition to being configured to instruct the 3D SIC to generate a result of a particular data processing function, the request can include at least one input parameter of the particular data processing function. At block 704, the volatile memory die 108 stores the request and communicates the request to the processing logic die 106. The volatile memory die 108 can be configured to store the request in at least one volatile partition of the volatile memory die.

At block 706, the stored request is received by the processing logic die. And, at block 706, the at least one input parameter of the particular data processing function can be received by the at least one processing logic partition through a TSV connecting the at least one volatile partition of the volatile memory die and the at least one processing logic partition.

At block 708, the processing logic die generates the result accordingly to the stored request. At least one processing logic partition of the processing logic die 106 can include the particular data processing function and the particular data processing function can generate the result according to the stored request and the at least one input parameter of the particular data processing function. The particular data processing function can be hardwired into the at least one processing logic partition of the processing logic die. Alternatively, the particular data processing function can be configured, by the controller 606 or another controller, in the at least one processing logic partition of the processing logic die temporarily. For example, the particular data processing function can be implemented by an FPGA configurable by the controller 606 or another controller.

At block 710, the processing logic die 106 communicates the result to the non-volatile memory die 102 and/or the non-volatile memory die 104. The processing logic die 106 can be configured to communicate the generated result of the particular data processing function to the non-volatile memory die via a TSV connecting at least one non-volatile partition of the non-volatile memory die and the at least one processing logic partition.

At block 712, the non-volatile memory die 102 and/or the non-volatile memory die 104 receives and stores the result that is communicated from the processing logic die 106. The non-volatile memory die 102 and/or the non-volatile memory die 104 can be configured to store the generated result in at least one non-volatile partition and communicate the stored result to the processing logic die 106 upon the processing logic die requesting the stored result. The processing logic die 106 requesting the stored result can be in response to the volatile memory die 108 requesting the stored result which can be in response to the controller 606 requesting the stored result via the bus 604.

The processing logic die 106 can be configured to retrieve the stored result from the non-volatile memory die via a TSV connecting the at least one non-volatile partition and the at least one processing logic partition. And, the 3D SIC can be configured to communicate the retrieved result to the volatile memory die via a TSV connecting the at least one volatile partition and the at least one processing logic partition. The volatile memory die can be configured to receive and store the retrieved result in the at least one volatile partition, and communicate, via the port, the stored retrieved result to the bus according to a second request of the controller, when the second request of the controller is configured to instruct the 3D SIC to retrieve a result generated by the particular data processing function. In some examples, where a read command is used by the controller 606 to make the second request, the second request is sent to the selected volatile memory partition of the volatile memory die 108.

With respect to FIG. 7, at block 714*a*, the controller communicates the second request that is configured to instruct the 3D SIC to retrieve a result generated by the particular data processing function. At block 714*b*, the second request is received, stored, and sent to the processing logic die 106, by the volatile memory die 108. At block 714*c*, the second request is received, stored, and forwarded to the non-volatile memory die 102 and/or the non-volatile memory die 104, by the processing logic die 106.

At block 716, in response to block 714*c*, the non-volatile memory die 102 and/or the non-volatile memory die 104 communicates the stored result to the processing logic die 106. At block 718, the processing logic die 106 receives the retrieved result, and at block 720, the processing logic die 106 communicates the retrieved result to the volatile memory die 108. The processing logic die 106 can be configured to retrieve the stored result from the non-volatile memory die via the TSV connecting the at least one non-volatile partition and the at least one processing logic partition. And, the processing logic die 106 can be configured to communicate the retrieved result to the volatile memory die via the TSV connecting the at least one volatile partition and the at least one processing logic partition.

At block 722, the volatile memory die 108 receives and stores the retrieved result sent from the processing logic die 106. At block 724, the retrieved result is then communicated to the controller 606, by the volatile memory die 108. The volatile memory die can be configured to receive and store the retrieved result in the at least one volatile partition as well as be configured to communicate, via the port, the stored retrieved result to the bus according to a second request of the controller configured to instruct the 3D SIC to retrieve a result generated by the particular data processing function.

At block 726, the controller 606 receives the retrieved result. The retrieve result can be used by the controller 606 for another processing step or outputted by the controller to another device.

In such embodiments, at least two of a volatile partition, a non-volatile partition, and a processing logic partition can be in the same one or more columns of the 3D SIC. For example, a volatile partition, a non-volatile partition, and a processing logic partition used together can be in the same one or more columns of the 3D SIC. Also, in some embodiments, each of two abutting functional blocks of the array of functional blocks can have different sub-particular data processing functions of the particular data processing function.

A particular data processing function (such as the particular data processing function described with the method 700) can include a fundamental process of the controller 606. For example, if the controller 606 is a CPU, the fundamental process can be a decoding process of the decode operation of a CPU. The processing logic die 106 can be programmed or hardwired as a decoder for a CPU or at least a common part or data intensive part of a decoder for a CPU. This way a CPU can reserve resources for fetching and execution operations, when connected to the 3D SIC 100.

The particular data processing function can also include the processing logic providing at least part of the functionality of an arithmetic logic unit of a CPU and such functionality can be programmed or hardwired into the processing logic die 106. And, abutting partitions of the processing logic die 106 can provide sub-operations of an arithmetic logic unit such as different integer arithmetic and bitwise logic operations. This way the CPU can reserve resources by delegating arithmetic logic unit operations to the 3D SIC 100.

Also, the processing logic die 106 can function as different types of encoders and/or decoders besides those usually hardwired or programmed into a CPU. For example, with embodiments of the 3D SIC 100 or at least a group of functional blocks of some embodiments, the 3D SIC 100 can provide an encryption function wherein the 3D IC or at least a group of functional blocks have a cipher hardwired or programmed into the processing logic die 106 so that the die can generate a ciphertext and then the ciphertext can be stored immediately in the non-volatile memory die 102 and/or the non-volatile memory die 104 of the 3D SIC 100 for subsequent retrieval by the controller 606. And, the processing logic die 106 or partitions of the die can function as a decryption algorithm. In one embodiment, one or more blocks of the 3D SIC 100 can be dedicated to encryption and other one or more blocks of the 3D IC can be dedicated to decryption.

Also, the 3D SIC 100 or at least a group of functional blocks of some embodiments can function as one or more certain data processing intensive operations, such as selected data intensive operations of a type of machine learning. And, data intensive operations that are immediately preceding or following each other in a machine learning algorithm or another type of complex computerized algorithm can be implemented by blocks of the 3D SIC 100 that are abutting each other. Thus, speeding up the transitional time between operations of an algorithm as well as providing other benefits such as reduced power consumption.

In some embodiments, a first memory IC of a 3D IC can provide non-volatile storage parts when the apparatus is powered on. Each non-volatile storage part of the non-volatile storage parts stores a bit while receiving power or not while receiving power. Also, a second memory IC of the 3D IC can provide volatile storage parts when the apparatus is powered on. Each volatile storage part of the volatile storage parts stores a bit only while receiving power. In such embodiments, electrical connections of the 3D IC can communicatively couple, in a second direction that is orthogonal to the first direction (e.g., a horizontal direction), first storage parts of the first memory IC to each other and second storage parts of the second memory IC to each other when the apparatus is powered on. And, electrical connections in a first direction (e.g., vertically) of the 3D IC can communicatively couple a control unit and an arithmetic/logic unit of a processing logic IC of the 3D IC to the storage parts of the first and second memory ICs to control use the storage parts, when the apparatus is powered on.

In such embodiments, during a machine cycle of the 3D IC, the control unit can get instructions from the first memory IC and/or the second memory IC during the instruction time of the machine cycle. And, during a machine cycle of the 3D IC the control unit or a decoder controlled by the control unit can decode the instructions and direct data to be moved from the first memory IC and/or the second memory IC to the arithmetic/logic unit according to at least part of the instructions during the instruction time. Also, during a machine cycle, the arithmetic/logic unit can execute the at least part of the instructions during the execution time of the machine cycle, and store a result of the execution of the at least part of the instructions in the first memory IC and/or the second memory IC during the execution time. Further, during a machine cycle, the control unit can direct the first memory IC and/or the second memory IC to release the result to an output device or a storage device external to the apparatus during the execution time.

In one example system of some embodiments, the system can include a first functional block that includes a first processing logic IC, a first memory IC, and a second memory IC. The first processing logic IC, the first memory IC, and the second memory IC can be arranged in a first direction (e.g., vertically) as a stack of ICs to form the first functional block. The system can also include a second functional block that can include a second processing logic IC, a third memory IC, and a fourth memory IC. The second processing logic IC, the third memory IC, and the fourth memory IC can be arranged in the first direction as a stack of ICs to form the second functional block. The system can also include at least one bus or an interconnect that communicatively couples the first functional block and the second functional block.

In such an example system, the first and second functional blocks are each configured differently from each other for different respective data processing functions. The data processing functions can be different frequently used functions and/or data intensive functions, such that even though each processing logic IC of a block may not have the processing power of a CPU, its advantage in improved (e.g., closer) data access to non-volatile and volatile memory so that it can provide a better overall performance in implementing selected functions. Each functional block of the first and second functional blocks can configurable on demand by a controller (e.g., a CPU) that is connected to the functional blocks via a wired and/or wireless bus. Each functional block of the first and second functional blocks can be configured to reduce the computation load of the controller. The configuration of each functional block of the first and second functional blocks can include on demand configuration of the respective processing logic IC of the functional block. Each functional block of the first and second functional blocks can be configured to operate independently from each other. Each functional block of the first and second functional blocks is configured to operate in parallel to provide parallel data processing.

In one example method of some embodiments implemented by multiple functional blocks of one or more 3D ICs, a functional block of the multiple functional blocks can perform a first data processing function that includes a processing logic IC controlling storage and retrieval of data to and from first and second memory ICs. The functional block can also be changed on demand (such as by a CPU), so that the functional block is configured to perform a second data processing function. The functional block can also perform the second data processing function that includes the processing logic IC controlling storage and retrieval of data to and from the first and second memory ICs in a different way from the way the processing logic IC controls storage and retrieval of data to and from the first and second memory ICs during the first data processing function. In such an example method, each functional block of the multiple functional blocks includes a respective processing logic IC, a respective first memory IC, and a respective second memory IC, and the respective processing logic IC, the respective first memory IC, and respective the second memory IC are arranged in a first direction (e.g., vertically) as a stack of ICs to form the functional block.

At least some aspects of the present disclosure are directed to 3D SICs having functional blocks configured to accelerate or implement ANN computation. Also, in general, aspects of the present disclosure are directed to 3D ICs having functional blocks configured to accelerate or implement ANN computation.

As illustrated herein, delineated blocks or columns of stacked chips, in a second direction that is orthogonal to the first direction (e.g., a horizontal direction), are configured to support or implement an ANN. Each block or column can be considered a separate ANN region configured to support the ANN. To put it another way, each block or column is adapted to locally host a portion of the data of a large model (e.g., ANN) and at least handle or accelerate the data intensive operations on the local data using the local processing capacity in the block or column. The stack or array of blocks/columns have communication facility to allow data exchange among the blocks to process the interactions among the portions of the large model.

A device of multiple stacked chips has a distribution, in a second direction that is orthogonal to the first direction (e.g., a horizontal direction), of the ANN regions that are connected via a grid network internal to the device. The connections of the grid network allow for fast access to neuron set output between neighboring ANN regions. The network can be scaled up by stacking in a first direction (e.g., vertically) for 3D integration and use a larger chip area for 2D integration. Also, multiple devices (e.g., multiple 3D SICs) can be further connected via a bus or computer network to implement or support a large ANN.

In some embodiments, a functional block of the device, which supports the ANN, can be a functional block similar to the functional blocks illustrated in FIGS. 1-5, in that the functional block is a general data processing block instead of a block specifically hardwired for supporting an ANN. In some other embodiments, the functional block of the device, which supports the ANN, can include specific hardware circuitry for artificial intelligence (AI) acceleration, such as specific hardware circuitry that includes units for or used in vector and/or matrix algebra calculations. Whether the functional block is more general or specifically adapted for an ANN, the hardware circuitry of the block can include adders and/or multipliers in the processing logic layer of the block (e.g., the respective processing logic partition of a processing logic die stacked in the device can include adders and/or multipliers). That way, processing units can be programmed for different types of neural network computations or a combination of neural network computations and other types of computations.

In some embodiments, as shown in the drawings, a 3D SIC arranges the functional blocks so that each block gets inputs from the nearest neighbors and outputs to the nearest neighbors in the array of blocks. This is advantageous because it increases the speed of the 3D SIC, reduces heat output of the 3D IC, and conserves the power input for the 3D SIC. Also, such an arrangement of the blocks provides for less connections between ANN regions being routed by intermediate block communications or inter-block communications.

Further, in some embodiments, load balancing can be used to evenly distribute ANN computations among the blocks of a 3D SIC. Load balancing can occur on a computer network scale or local device level. Load balancing can further increase the speed of the 3D SIC, reduce heat output of the 3D IC, and conserve the power input for the 3D SIC. Also, it may be advantageous to load balance both on computer network and local device levels. In some examples, a stack can be used to model a subnetwork among a set of interconnected stacks, just like a block is used to model a subnetwork among a network represented by interconnected blocks in a stack.

Each functional block of the 3D SIC can implement or support a set of neurons, with inputs of the set of neurons coming from the connections that are at the block boundary and outputs going out of the block boundary of a given functional block. For a set of assumed inputs coming from other blocks, the outputs can be computed precisely within the given functional block. When the other blocks have updated outputs to correct the assumptions, the given block can update its outputs that in turn update its outputs to correct the outputs for other blocks that depend on the given block for input. Multiple chip extensions through a bus of a computer system or a computer network is based on a similar principle.

An advantage of such an assumption-correction approach is improved training of the ANN. Also, such an approach can improve the prediction accuracy of the ANN. In training, the ANN model implemented by the 3D SIC is adjusted to match the predicted results with observed and/or measured results. During prediction, the blocks can be sequentially operated according to the flow of the outputs such that there may be no need for one or more assumptions. Special-purpose hardware acceleration can be advantageous in both training and prediction phases of the ANN.

It is to be understood that a functional block or a group of functional blocks described herein is not necessarily required to do a full ANN computation such as a full ANN computation of input/out and hidden layer neurons or nodes. Rather, a functional block or a group of functional bocks can be configured as helpers or accelerators of a full ANN computation. It is advantageous to use one or more functional blocks of the 3D SIC to perform data-intensive and/or common computations that are part of a full ANN computation to utilize the advantages in data access and/or special-purpose hardware acceleration of the 3D SIC. It is also to be understood that a functional block or a group of functional blocks described herein can perform a full ANN computation such as a full ANN computation of input/out and hidden layer neurons or nodes.

Figure 8:
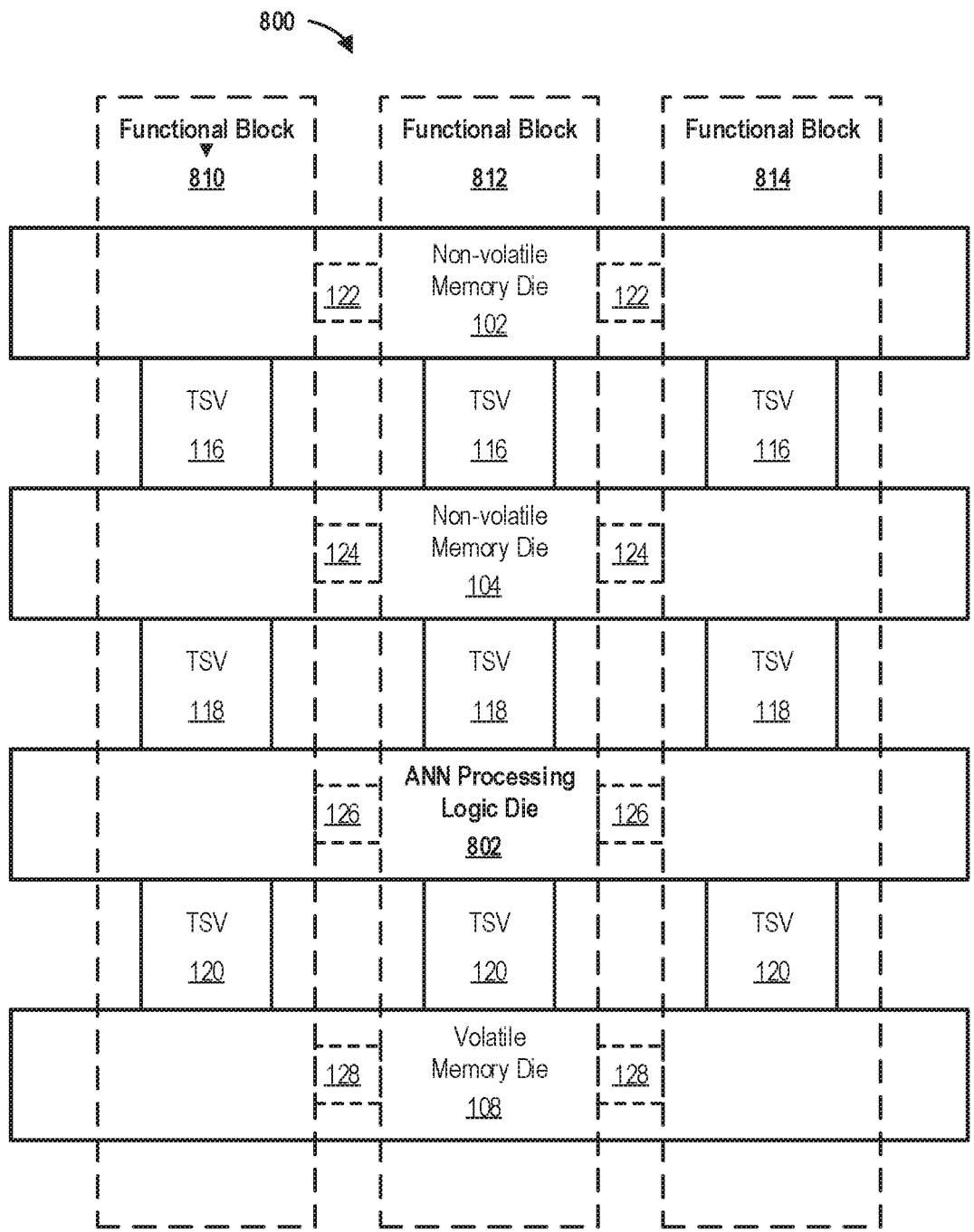
FIG. 8 illustrates a front view of an example 3D SIC implementing ANN functional blocks (also referred to as an ANN 3D SIC) in accordance with some embodiments of the present disclosure.

FIG. 8 illustrates a front view of an example 3D SIC 800 implementing ANN functional blocks (e.g., functional blocks 810, 812, and 814) and having non-volatile memory dies 102 and 104, a volatile memory die 108, and an ANN processing logic die 802 in accordance with some embodiments of the present disclosure. As shown, the non-volatile memory dies 102 and 104, the volatile memory die 108, and the ANN processing logic die 802 are arranged to form an array of functional blocks.

It is to be understood that the 3D SIC 800 has similar parts of the 3D SIC 100 of FIG. 1, except the processing logic die 802 is specifically configured to support or implement neurons. Thus, functional blocks of the 3D SIC 800 may or may not have the same physical structure as the functional blocks of the 3D SIC 100. With that said, it is to be understood that the memory dies (e.g., dies 102, 104, and 108), the TSVs (e.g., TSVs 116, 118, and 120), the interconnects (e.g., interconnects 122, 124, 126, and 128) are similar between the 3D SIC 100 and the 3D SIC 800 for the purposes of simplifying this disclosure.

In general, the 3D SIC 800 can implement or support an ANN. And, each functional block of the 3D SIC 800 can provide a respective ANN region.

As mentioned, the 3D SIC 800 includes non-volatile memory dies 102 and 104. Other embodiments can include one non-volatile memory die or more than two non-volatile memory dies. A non-volatile memory die of embodiments can be a 3DXP die or include other types of non-volatile memory such as described herein. In some embodiments, a non-volatile memory die can include an array of non-volatile memory partitions (e.g., see the non-volatile memory partitions of FIG. 2). In such embodiments, each partition of the array of on-volatile memory partitions can be configured to store first parameters of a set of neurons.

The 3D SIC 800 also includes the volatile memory die 108. Other embodiments can include more than one volatile memory die. A volatile memory die of embodiments can be a DRAM die or include other types of volatile memory such as described herein. In some embodiments, a volatile memory die can include an array of volatile memory partitions (e.g., see the volatile memory partitions of FIG. 3). In such embodiments, each partition of the array of volatile memory partitions can be configured to store second parameters of the set of neurons.

The 3D SIC 800 also includes a processing logic die. More specifically, 3D SIC includes an ANN processing logic die 802. Other embodiments can include more than one processing logic die, such as more than one ANN processing logic die 802. In some embodiments, the ANN processing logic die 802 can include an array of processing logic partitions. Each partition of an array of partitions of the ANN processing logic die 802 can be a separate FPGA, such as shown by the processing logic die 106 in FIG. 4. In general, each partition of the array of processing logic partitions can be configured to receive input data and process the input data according to the respective set of neurons of the partition to generate output data.

Also, similar to some other embodiments described herein, the 3D SIC 800 includes TSVs 116, 118, and 120 that interconnect the non-volatile memory dies 102 and 104, the volatile memory die 108, and a processing logic die which in the example of FIG. 8 is the ANN processing logic die 802.

Figure 9:
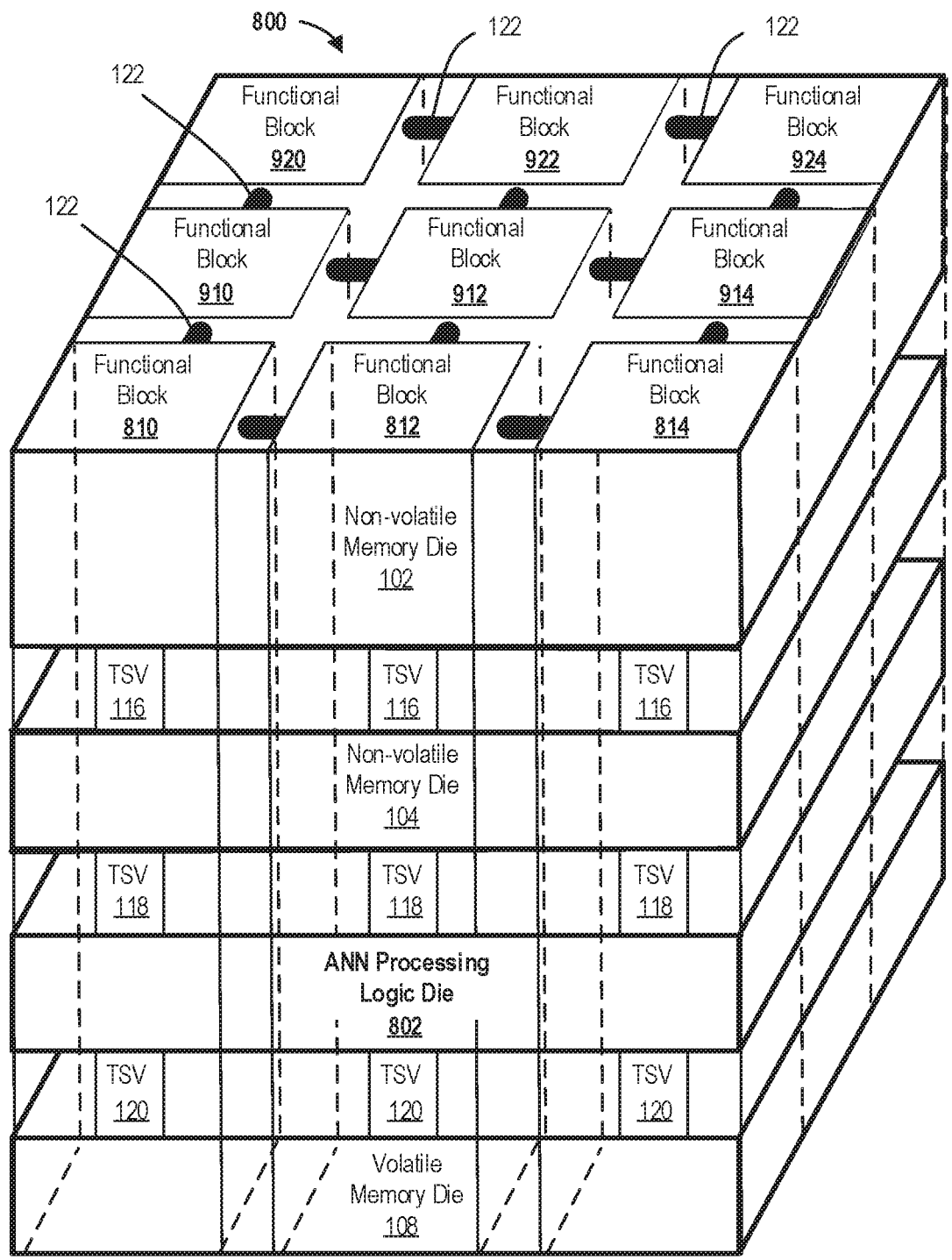
FIG. 9 illustrates a perspective view of the example 3D SIC illustrated in FIG. 8 implementing ANN functional blocks and having multiple non-volatile memory dies, a volatile memory die, and an ANN processing logic die in accordance with some embodiments of the present disclosure.

FIG. 9 illustrates a perspective view of the example 3D SIC 800 illustrated in FIG. 8 implementing ANN functional blocks (e.g., functional blocks 810, 812, and 814) and having non-volatile memory dies 102 and 104, a volatile memory die 108, and an ANN processing logic die 802 in accordance with some embodiments of the present disclosure. Specifically, FIG. 9 shows all the functional blocks of 3D SIC 800, i.e., FIG. 9 shows functional blocks 810, 812, 814, 910, 912, 914, 920, 922, and 924.

It is to be understood that the 3D SIC 800, as shown in FIG. 9, has similar parts of the 3D SIC 100 of FIG. 5, except the processing logic die 802 is specifically configured to support or implement neurons. Thus, functional blocks of the 3D SIC 800 may or may not have the same physical structure as the functional blocks of the 3D SIC 100. With that said, it is to be understood that the memory dies (e.g., dies 102, 104, and 108), the TSVs (e.g., TSVs 116, 118, and 120), the interconnects (e.g., interconnects 122, 124, 126, and 128) are similar between the 3D SIC 100 and the 3D SIC 800 for the purposes of simplifying this disclosure. And, the functional blocks 810, 812, 814, 910, 912, 914, 920, 922, and 924 of the 3D SIC 800, as shown in FIG. 9, may or may not be similar in structure to the functional blocks 110, 112, 114, 210, 212, 214, 220, 222, and 224 of the 3D SIC 100, as shown in FIG. 5.

A functional block of the array of functional blocks of 3D SIC 800 (e.g., functional block 810, 812, 814, 910, 912, 914, 920, 922, or 924) can include a respective processing logic partition including a hardware circuit configured to perform the computation of an activation function. The activation function can include a sigmoid activation function or a radial basis function. Also, other types of activation functions can be performed by the hardware circuit. The activation function can be a step function, a linear function, or a log-sigmoid function. With a complex function (e.g., log-sigmoid function, sigmoid function, etc.), it may be preferable to implement the processing logic partition with a specifically configured circuit for improved efficiency, such as by using an ASIC. Otherwise, it may be advantageous to use a FPGA.

Also, a functional block of the array of functional blocks of 3D SIC 800 (e.g., functional block 810, 812, 814, 910, 912, 914, 920, 922, or 924) can include a respective processing logic partition having an AI accelerator that is configured to execute vector algebra operations. Also, a functional block of the array of functional blocks of 3D SIC 800 can include a respective processing logic partition having an AI accelerator that is configured to execute matrix algebra operations. Also, a functional block of the array of functional blocks of 3D SIC 800 can include a respective processing logic partition having an AI accelerator that is configured to execute vector algebra operations and matrix algebra operations.

Each functional block of the array of functional blocks of 3D SIC 800 (functional block 810, 812, 814, 910, 912, 914, 920, 922, or 924) can include a respective processing logic partition including a processing core of a many core processor. Also, each functional block of the array of functional blocks can include a respective processing logic partition including a part of a graphics processing unit (GPU). In such examples, the part of the GPU can be or include a fixed functional unit.

Similar to the functional blocks of 3D SIC 100, each functional block of the array of functional blocks of the 3D SIC 800 (functional block 810, 812, 814, 910, 912, 914, 920, 922, or 924) can include a respective processing logic partition having an FPGA. An example of an array of process logic partitions wherein each partition has an FPGA is depicted in FIG. 4. In some other embodiments, each functional block of the array of functional blocks can include a respective processing logic partition having an ASIC.

Figure 10:
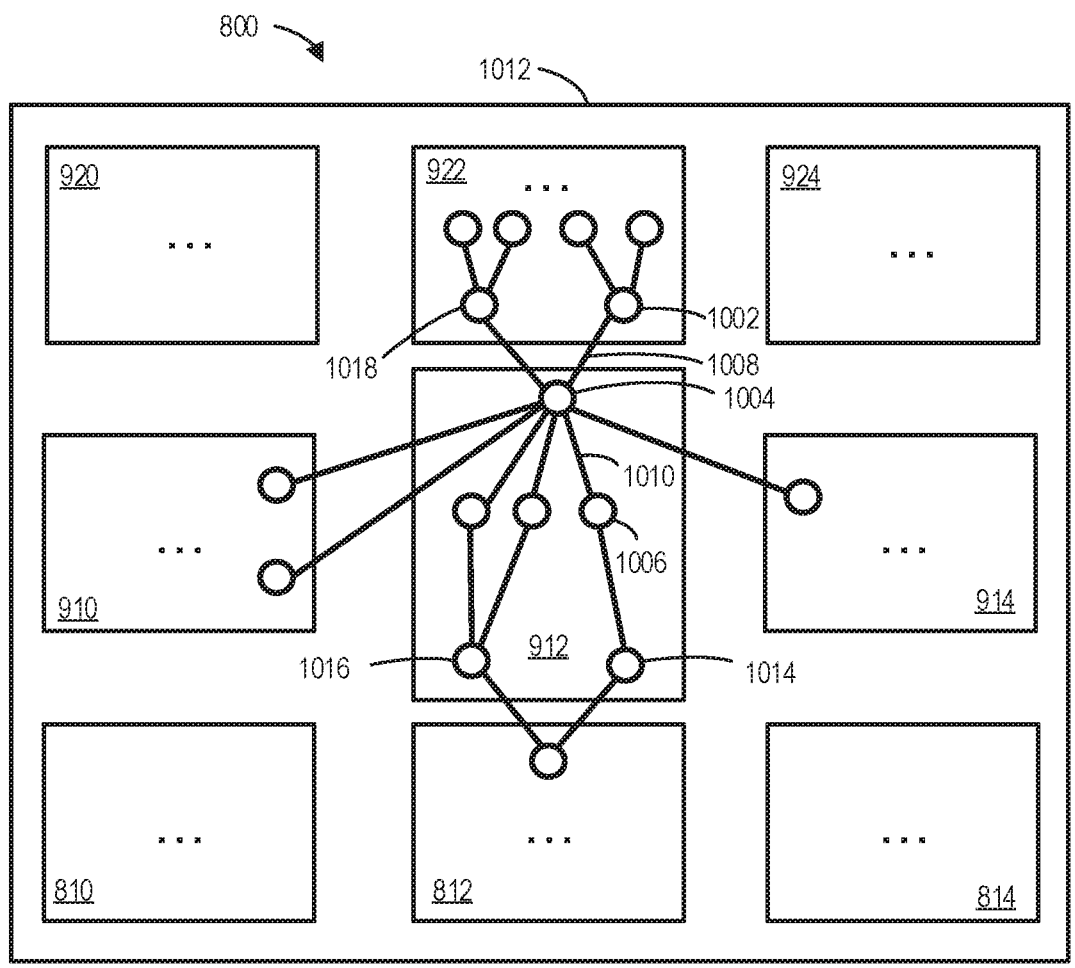
FIG. 10 illustrates a top view of the example 3D SIC illustrated in FIGS. 8 and 9 in accordance with some embodiments of the present disclosure.

FIG. 10 illustrates a top view of the example 3D SIC 800 illustrated in FIG. 8 in accordance with some embodiments of the present disclosure. FIG. 10 specifically shows some hypothetical neurons (e.g., neurons 1002, 1004, 1006) and neuron synapses (e.g., neuron synapse 1008 and 1010) implemented by the functional blocks of the 3D SIC 800. FIG. 10 illustrates the partitioning of an ANN into portions for local processing in blocks, not the exact structure of a 3D SIC. The neurons and synapses are represented by the data stored there and the processing logics, not the hardware elements and connections.

In some embodiments, each functional block of the array of functional blocks (e.g., functional block 810, 812, 814, 910, 912, 914, 920, 922, or 924) can use a respective network of neurons (such as input/output and hidden layer neurons) to process one or more inputs to the network and to generate one or more outputs from the network. In some examples, each neuron m in the network can receive a set of inputs $p_k$, where k=1, 2, . . . , n. Some of the inputs to a neuron may be the outputs of certain neurons in the network; and some of the inputs to a neuron may be the inputs to the network as a whole. The input/output relations among the neurons in the network represent the neuron connectivity in the network. Each neuron m can have a bias $b_m$, an activation function $f_m$, and a set of synaptic weights $w_{mk}$ for its inputs $p_k$ respectively, where k=1, 2, . . . , n. Different neurons in the network may have different activation functions. Each neuron m can generate a weighted sum $s_m$ of its inputs and its bias, where $s_m = b_m + w_{m1} \times p_1 + w_{m2} \times p_2 + \ldots + w_{mn} \times p_n$. The output $a_m$ of the neuron m can be the activation function of the weighted sum, where $a_m = f_m(s_m)$. The relations between the input(s) and the output(s) of an ANN in general can be defined by an ANN model that includes the data representing the connectivity of the neurons in the network, as well as the bias $b_m$, activation function $f_m$, and synaptic weights $w_{mk}$ of each neuron m. Using a given ANN model a computing device can compute the output(s) of the network from the input(s) to the network.

Neurons 1002 and 1004 are inter-connected neurons in that each of these neurons is part of a different functional block and that output of one of the neurons is input for the other neuron. The neuron synapse 1008 is an inter-connecting synapse. Also, neurons 1002 and 1004 are edge neurons or input/out layer neurons in general in that one of the neurons is part of an input layer of its respective functional block and the other neuron is part of an output layer of its respective functional block. Neurons 1004 and 1006 are intra-connected neurons in that each neuron is part of the same functional block and that output of one of the neurons is input for the other neuron. Also, neuron 1006 may be a hidden or middle layer neuron. The neuron synapse 1010 is an intra-connecting synapse. The inter-connecting synapses and/or the intra-connecting synapses can have respective synaptic weights.

It is to be understood for the purposes of this disclosure that the neurons and neuron synapses connecting the neurons in FIG. 10 are imaginary. To put it another way, the illustrated hypothetical neurons (e.g., neurons 1002, 1004, and 1006) and neuron synapses connecting the hypothetical neurons (e.g., neuron synapses 1008 and 1010) are not biological neurons and neuron synapses or synthetic physical alternatives to biological neurons and neuron synapses. Such real biological or synthetic mechanisms do not exist or are not created in the functional blocks 810, 812, 814, 910, 912, 914, 920, 922, and 924 of the 3D SIC 800. As mentioned herein, the neurons and neuron synapses are implemented algorithmically by the functional blocks in that the basis of the neurons and neuron synapses are part of software instructions and/or data processing hardware circuitry. Also, it is to be understood that each ellipsis in functional blocks 810, 812, 814, 910, 914, 920, and 924 signifies that the set of neurons in a block is not completely shown. And, it is to be understood that the shape and size of the functional block 912 does not illustrate its relative shape and size to the other blocks.

FIG. 10 also shows a housing 1012 that encloses the functional blocks 810, 812, 814, 910, 912, 914, 920, 922, and 924 of the 3D SIC 800.

Additionally, FIG. 10 shows a first functional block (i.e., the functional block 912) and a second functional block (i.e., the functional block 922) of the array of functional blocks being next to each other, and the functional block 912 including a different set of neurons from the functional block 922. The functional block 912 includes a respective column of the 3D SIC 800 and a first set of neurons (e.g., see neurons 1004, 1006, 1014, 1016, etc.). And, the functional block 912 includes a first respective non-volatile memory partition of the array of non-volatile memory partitions of 3D SIC 800 that is configured to store a non-volatile stored set of parameters of the first set of neurons. The functional block 912 further includes a first respective volatile memory partition of the array of volatile memory partitions that is configured to store a volatile stored set of parameters of the first set of neurons. The functional block 912 also includes a first respective processing logic partition of the array of processing logic partitions that is configured to receive first input data at neurons 1014 and 1016 and process the first input data according to the first set of neurons to generate first output data at neuron 1004.

The functional block 922 includes a respective column of the 3D SIC 800 and a second set of neurons (e.g., see neurons 1002, 1018, etc.). And, the functional block 922 includes a second respective non-volatile memory partition of the array of non-volatile memory partitions of 3D SIC 800 that is configured to store a non-volatile stored set of parameters of the second set of neurons. The functional block 922 further includes a second respective volatile memory partition of the array of volatile memory partitions that is configured to store a volatile stored set of parameters of the second set of neurons. The functional block 922 also includes a second respective processing logic partition of the array of processing logic partitions that is configured to receive second input data at neurons 1002 and 1018, which is the first output data from the functional block 912, and process the second input data according to the second set of neurons to generate second output data at one or more neurons (which is not shown in FIG. 10 specifically).

In some embodiments, the respective volatile stored sets of parameters of the first set of neurons and the second set of neurons can each include synaptic weights of the neurons. Also, in some embodiments, the respective non-volatile stored sets of parameters of the first set of neurons and the second set of neurons can each include biases of neurons.

In some embodiments, the 3D SIC 800 is a networked 3D SIC belonging to a network of 3D SICs, and in such embodiments, each 3D SIC of the network is for implementing or supporting an ANN and includes at least a non-volatile memory die, a volatile die, and a processing logic die. The networked 3D SICs can be networked over a bus in a single computer system (such as shown in FIG. 11) and/or the networked 3D SIC can be networked over a computer network such that the 3D SIC 800 is networked with 3D SICs of other computer systems connected to the computer system of the 3D SIC 800 via a computer network (such as shown in FIG. 12).

Figure 11:
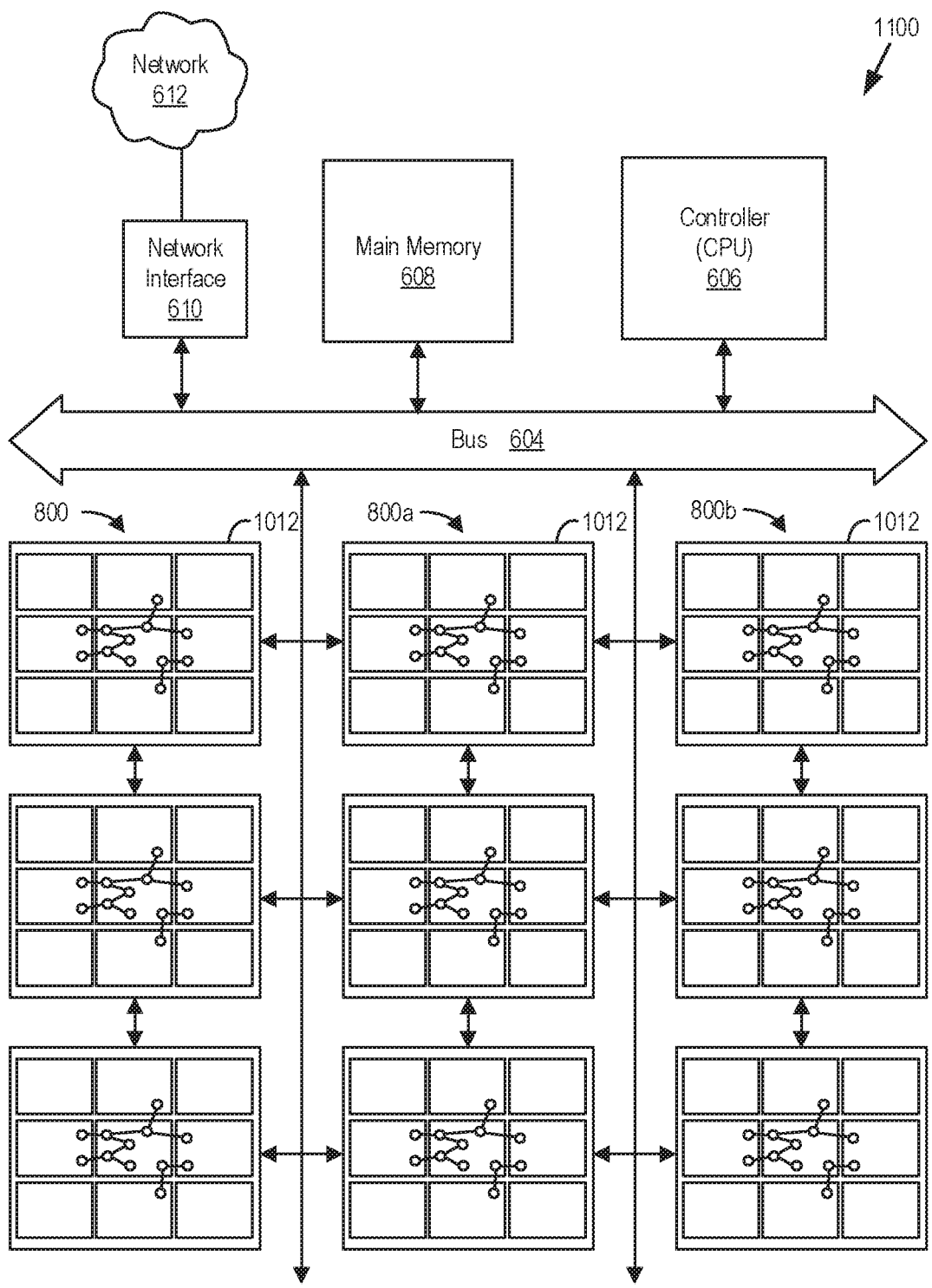
FIG. 11 illustrates a block diagram of an example computer system having a set of 3D SICs in which embodiments of the present disclosure can operate, wherein the 3D SICs are configured to implement or support an ANN.

FIG. 11 illustrates a block diagram of an example computer system 1100 having a set of 3D SICs, including 3D SICs 800, 800a, and 800b, in which embodiments of the present disclosure can operate. FIG. 11 depicts how an ANN can be scaled up by increasing the number of ANN 3D SICs in a single computer system. The ANN 3D SICs of FIG. 11, including ANN 3D SICs 800a, 800b, and 800 (depicted in FIGS. 8-10), are configured to implement or support an ANN. It is to be understood, that ANN 3D SICs 800a and/or 800b can be similar in structure to ANN 3D SIC 800, but can each have different functionalities from ANN 3D SIC 800 (such as different sub-ANN). Alternatively, ANN 3D SICs 800a and/or 800b can each have similar functionalities as ANN 3D SIC (such as similar sub-ANN), so that ANN 3D SICs 800a and/or 800b can provide distribution of the workload of the ANN 3D SIC 800.

As shown, computer system 1100 includes bus 604, controller 606, main memory 608, and network interface 610 that can connect the computer system 1100 to network 612. These components of system 1100 are similar to the corresponding components of the computer system 600 of FIG. 6. Also, similarly, each ANN 3D SIC of the computer system 1100 has a corresponding communications interface similar to the communication interface 602 of computer system 600. As shown, there are nine ANN 3D SICs in the set of 3D SICs of computer system 1100. However, it is to be understood that some embodiments can have more than nine ANN 3D SICs per computer system or less than nine 3D SICs (e.g., the computer system 600 is depicted only showing one 3D SIC which can be one ANN 3D SIC).

Figure 12:
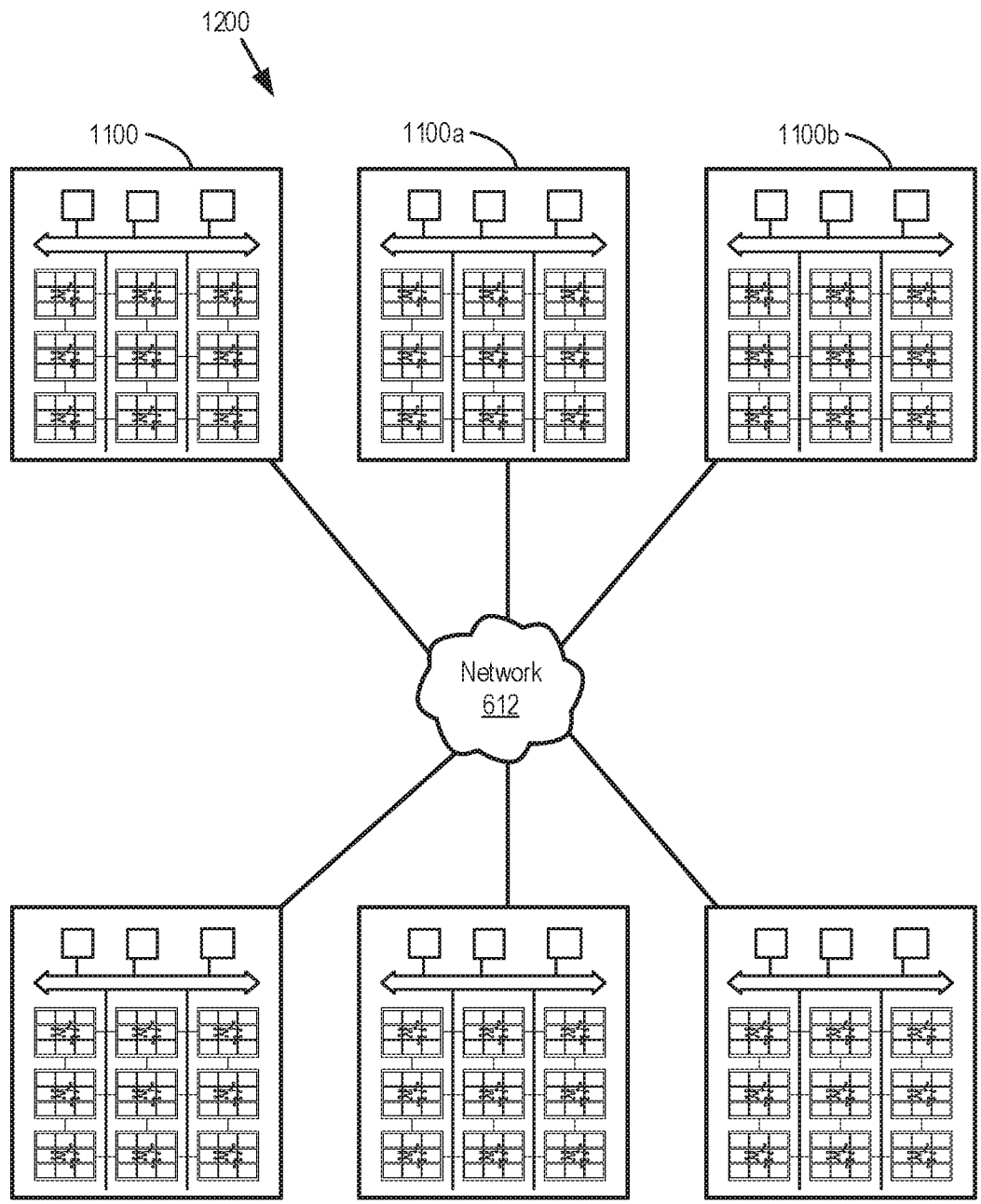
FIG. 12 illustrates a block diagram of an example network of computer systems in which embodiments of the present disclosure can operate, wherein each computer system has a set of 3D SICs and wherein the 3D SICs are configured to implement or support an ANN.

FIG. 12 illustrates a block diagram of an example network of computer systems 1200 in which embodiments of the present disclosure can operate. Each computer system depicted in FIG. 12, including computer systems 1100, 1100a, and 1100b, has a set of 3D SICs. And, the 3D SICs of FIG. 12 are configured to implement or support a large ANN. FIG. 12 depicts how an ANN can be scaled up by increasing the number of ANN 3D SICs by networking multiple computer systems that each have multiple ANN 3D SICs.

The computer systems of FIG. 12 each having multiple ANN 3D SICs, including computer systems 1100a, 1100b, and 1100 (depicted in FIG. 11), are configured to implement or support an ANN. It is to be understood, that ANN 3D SICs 1100a and/or 1100b can be similar in structure to computer system 1100, but can each have different functionalities (such as different sets of sub-ANN) from computer system 1100. Alternatively, ANN 3D SICs 1100a and/or 1100b can each have similar functionalities (such as similar sub-ANN) as the computer system 1100, so that computer systems 1100a and/or 1100b can provide distribution of the workload of the computer system 1100.

As shown, network 1200 includes the network 612 and a plurality of computer systems that each have multiple ANN 3D SICs. Although nine network computer systems are shown in the network 1200, it is to be understood that some embodiments can have more than nine computer systems having ANN 3D SICs or less than nine computer systems having ANN 3D SICs.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. An integrated circuit comprising:
a memory die comprising an array of memory partitions, wherein each partition of the array of memory partitions is configured to store parameters of a set of neurons; and
a processing logic die comprising an array of processing logic partitions, wherein each partition of the array of processing logic partitions is configured to:
receive input data; and
process the input data according to the set of neurons to generate output data.

2. The integrated circuit of claim 1, wherein the integrated circuit is a three-dimensional stacked integrated circuit (3D SIC) belonging to a network of 3D SICs, and wherein each 3D SIC of the network is for implementing an artificial neural network (ANN) and comprises:
a memory die comprising an array of memory partitions, wherein each partition of the array of memory partitions is configured to store parameters of a set of neurons; and
a processing logic die comprising an array of processing logic partitions, wherein each partition of the array of processing logic partitions is configured to:
receive input data; and
process the input data according to the set of neurons to generate output data.

3. The integrated circuit of claim 1, wherein the memory die and the processing logic die are arranged to form an array of functional blocks, and wherein a first functional block and a second functional block of the array of functional blocks are next to each other, and wherein the first functional block comprises a different set of neurons from the second functional block.

4. The integrated circuit of claim 3, wherein the integrated circuit is a three-dimensional stacked integrated circuit (3D SIC) and the first functional block of the array of functional blocks comprises a respective column of the 3D SIC that comprises:
a first respective memory partition of the array of memory partitions, configured to store a set of parameters of a first set of neurons; and
a first respective processing logic partition of the array of processing logic partitions, configured to:
receive first input data; and
process the first input data according to the first set of neurons to generate first output data.

5. The integrated circuit of claim 4, wherein the second functional block of the array of functional blocks comprises a respective column of the 3D SIC that comprises:
- a second respective memory partition of the array of memory partitions, configured to store a set of parameters of a second set of neurons; and
- a second respective processing logic partition of the array of processing logic partitions, configured to:
  - receive second input data, which is the first output data from the first functional block; and
  - process the second input data according to the second set of neurons to generate second output data.

6. The integrated circuit of claim 5, wherein the respective sets of parameters of the first set of neurons and the second set of neurons each comprise synaptic weights of neurons.

7. The integrated circuit of claim 5, wherein the respective sets of parameters of the first set of neurons and the second set of neurons each comprise biases of neurons.

8. The integrated circuit of claim 3, wherein a functional block of the array of functional blocks comprises a respective processing logic partition comprising a hardware circuit configured to perform a computation of an activation function.

9. The integrated circuit of claim 8, wherein the activation function is a sigmoid activation function.

10. The integrated circuit of claim 8, wherein the activation function is a radial basis function.

11. The integrated circuit of claim 3, wherein a functional block of the array of functional blocks comprises a respective processing logic partition comprising an artificial intelligence (AI) accelerator that is configured to execute at least one of vector algebra operations and matrix algebra operations.

12. The integrated circuit of claim 3, wherein each functional block of the array of functional blocks comprises a respective processing logic partition comprising a processing core of a many core processor.

13. The integrated circuit of claim 3, wherein each functional block of the array of functional blocks comprises a respective processing logic partition comprising a part of a graphics processing unit (GPU).

14. The integrated circuit of claim 13, wherein the part of the GPU is a fixed functional unit.

15. The integrated circuit of claim 3, wherein each functional block of the array of functional blocks comprises a respective processing logic partition comprising a field-programmable gate array (FPGA).

16. The integrated circuit of claim 3, wherein each functional block of the array of functional blocks comprises a respective processing logic partition comprising an application-specific integrated circuit (ASIC).

17. A system, comprising:
- a bus;
- a plurality of three-dimensional stacked integrated circuits (3D SICs) connected to each other via the bus, wherein each of the 3D SICs is configured to implement an artificial neural network (ANN);
- a memory die configured to store parameters of a set of neurons; and
- a processing logic die configured to process input data according to the set of neurons to generate output data.

18. The system of claim 17, wherein the memory die and the processing logic die are arranged to form an array of functional blocks, and wherein a first functional block and a second functional block of the array of functional blocks are next to each other, and wherein the first functional block comprises a different set of neurons from the second functional block.

19. An integrated circuit comprising:
- a memory die comprising an array of memory partitions, wherein each partition of the array of memory partitions is configured to store parameters of a set of neurons;
- a processing logic die comprising an array of processing logic partitions, wherein each partition of the array of processing logic partitions is configured to:
  - receive input data; and
  - process the input data according to the set of neurons to generate output data; and
- a plurality of through silicon vias (TSVs) that interconnect the memory die and the processing logic die.

* * * * *